(12) United States Patent
Lee et al.

(10) Patent No.: US 11,846,965 B2
(45) Date of Patent: Dec. 19, 2023

(54) TOUCH DISPLAY APPARATUS AND METHOD OF MANUFACTURING THE SAME

(71) Applicant: LG Display Co., Ltd., Seoul (KR)

(72) Inventors: Hwan Keon Lee, Seoul (KR); Nam Kook Kim, Suwon-si (KR); Sang Hyuk Won, Gimpo-si (KR); Seon Hee Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/561,555

(22) Filed: Dec. 23, 2021

(65) Prior Publication Data

US 2022/0206620 A1 Jun. 30, 2022

(30) Foreign Application Priority Data

Dec. 31, 2020 (KR) .................. 10-2020-0190025
Nov. 22, 2021 (KR) .................. 10-2021-0161248

(51) Int. Cl.
*G09G 5/00* (2006.01)
*G06F 3/041* (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .. G06F 3/0412; G06F 3/0446; G06F 3/04164; G06F 3/0443; G06F 2203/04111;
(Continued)

(56) References Cited

U.S. PATENT DOCUMENTS

| 10,763,857 B2 | 9/2020 | Kim et al. |
| 10,890,994 B2 | 1/2021 | Park et al. |

(Continued)

FOREIGN PATENT DOCUMENTS

| CN | 111580698 A | 8/2020 |
| KR | 10-2017-0123482 A | 11/2017 |

(Continued)

OTHER PUBLICATIONS

European Patent Office, Extended European Search Report and Opinion, EP Patent Application No. 21218095.4, dated May 27, 2022, ten pages.

(Continued)

*Primary Examiner* — Jennifer T Nguyen
(74) *Attorney, Agent, or Firm* — Fenwick & West LLP

(57) ABSTRACT

A touch display apparatus is provided. The touch display apparatus may include an encapsulating unit covering light-emitting devices, a touch sensor on the encapsulating unit, and a black matrix on the touch sensor. The touch sensor may include first touch electrode disposed side by side, first bridge electrodes connecting the first touch electrodes in a first direction, second touch electrodes disposed between the first touch electrodes, and second bridge electrodes connecting the second touch electrode in a second direction perpendicular to the first direction. The second bridge electrodes may cross the first bridge electrodes. The second bridge electrodes may be disposed on a layer different from the second touch electrodes. For example, the second touch electrodes may be disposed on the same layer as the first touch electrodes and the first bridge electrodes. The planar shape of the black matrix may be the same as the planar shape by the first touch electrodes, the first bridge electrodes and the second touch electrodes. Thus, in the touch display apparatus, the process efficiency may be improved.

17 Claims, 26 Drawing Sheets

(51) Int. Cl.
*G06F 3/044* (2006.01)
*H10K 50/844* (2023.01)
*H10K 50/86* (2023.01)
*H10K 59/38* (2023.01)
*H10K 59/40* (2023.01)
*H10K 59/122* (2023.01)
*H10K 71/00* (2023.01)
*H10K 59/12* (2023.01)

(52) U.S. Cl.
CPC ....... *G06F 3/04164* (2019.05); *H10K 50/844* (2023.02); *H10K 50/865* (2023.02); *H10K 59/122* (2023.02); *H10K 59/38* (2023.02); *H10K 59/40* (2023.02); *H10K 71/00* (2023.02); *G06F 2203/04111* (2013.01); *G06F 2203/04112* (2013.01); *H10K 59/1201* (2023.02)

(58) Field of Classification Search
CPC .......... G06F 2203/04112; H10K 59/40; H10K 59/122; H10K 71/00; H10K 59/38; H10K 50/865; H10K 50/844; H10K 59/1201
USPC ......................................................... 345/174
See application file for complete search history.

(56) References Cited

U.S. PATENT DOCUMENTS

| | | |
|---|---|---|
| 2017/0353181 A1 | 12/2017 | Kim et al. |
| 2018/0095566 A1* | 4/2018 | Lee .................. H10K 71/00 |
| 2018/0095570 A1* | 4/2018 | Hong ................ G06F 3/0446 |
| 2018/0331160 A1* | 11/2018 | Beak ................. H10K 50/81 |
| 2019/0064960 A1 | 2/2019 | Na et al. |
| 2019/0121475 A1 | 4/2019 | Park et al. |
| 2019/0179466 A1* | 6/2019 | Kim .................. H10K 59/35 |
| 2020/0168671 A1 | 5/2020 | Jang et al. |
| 2020/0358437 A1 | 11/2020 | Kim et al. |
| 2020/0379596 A1 | 12/2020 | Park et al. |
| 2021/0202812 A1* | 7/2021 | Lee .................. H10K 50/865 |
| 2022/0261117 A1 | 8/2022 | Cui et al. |

FOREIGN PATENT DOCUMENTS

| | | |
|---|---|---|
| KR | 10-2017-0136687 A | 12/2017 |
| KR | 10-2019-0073149 A | 6/2019 |

OTHER PUBLICATIONS

European Patent Office, Examination Report, European Application No. 21218095.4, dated May 12, 2023, seven pages.

* cited by examiner

TOUCH DISPLAY APPARATUS AND METHOD OF MANUFACTURING THE SAME

CROSS-REFERENCE TO RELATED APPLICATIONS

This application claims the benefit of Korean Patent Applications No. 10-2020-0190025 filed on Dec. 31, 2020, and No. 10-2021-0161248 filed on Nov. 22, 2021, both of which are hereby incorporated by reference as if fully set forth herein.

BACKGROUND OF THE INVENTION

Field of the Invention

The present disclosure relates to a touch display apparatus in which a touch sensor is disposed on light-emitting devices.

Discussion of the Related Art

In general, a display apparatus provides an image to a user. For example, the display apparatus may include a plurality of light-emitting devices. Each of the light-emitting devices may emit light displaying a specific color. For example, each of the light-emitting device may include a light-emitting layer between a first emission electrode and a second emission electrode.

The display apparatus may perform a specific program or apply a specific signal by a touch of a user and/or a tool. For example, the display apparatus may be a touch display apparatus including a touch sensor. The touch sensor may be disposed on an encapsulating unit covering the light-emitting devices. For example, the touch sensor may include first touch electrodes disposed side by side on the encapsulating unit, first bridge electrodes connecting the first touch electrodes in a first direction, second touch electrodes disposed between the first touch electrodes, and second bridge electrode connecting the second touch electrodes in a second direction perpendicular to the first direction.

The first touch electrodes, the first bridge electrodes, the second touch electrodes and the second bridge electrodes may include a material having a relative low resistance. For example, the first touch electrodes, the first bridge electrodes, the second touch electrodes and the second bridge electrodes may include a metal. The first touch electrodes, the first bridge electrodes, the second touch electrodes and the second bridge electrodes may be disposed outside the light-emitting devices.

In the touch display apparatus, color filters and a black matrix may be disposed on the touch sensor to prevent reflection of external light. The color filters and the black matrix may be disposed on a planarization layer covering the touch sensor. However, in the touch display apparatus, the forming process may be complicated by the touch sensor, the color filters and the black matrix, which are individually formed, and the process efficiency may be lowered.

SUMMARY OF THE INVENTION

Accordingly, the present disclosure is directed to a touch display apparatus that substantially obviates one or more problems due to limitations and disadvantages of the related art.

An object of the present disclosure is to provide a touch display apparatus capable of improving the process efficiency.

Another object of the present disclosure is to provide a touch display apparatus capable of simplifying the process of forming the touch sensor and the black matrix.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a touch display apparatus comprising a device substrate. Light-emitting devices and an encapsulating unit are disposed on a display area of the device substrate. The encapsulating unit covers the light-emitting devices. A touch insulating layer is disposed on the encapsulating unit. A first touch line is disposed on the touch insulating layer. The first touch line includes first touch electrodes and first bridge electrodes. The first bridge electrodes connect the first touch electrodes in a first direction. A second touch line includes second touch electrodes and second bridge electrodes. The second bridge electrodes are disposed between the encapsulating unit and the touch insulating layer. The second touch electrodes are disposed on the same layer as the first touch electrodes and the first bridge electrodes. The second touch electrodes are connected by the second bridge electrodes in a second direction. The second direction may be perpendicular to the first direction. A black matrix is disposed on the first touch electrodes, the first bridge electrodes and the second touch electrodes. The first touch line, the second touch line and the black matrix are disposed outside the light-emitting devices. The planar shape of the black matrix is the same as the planar shape by the first touch electrodes, the first bridge electrodes and the second touch electrodes.

The black matrix may be in contact with an upper surface of each first touch electrode, an upper surface of each first bridge electrode and an upper surface of each second touch electrode, which are opposite to the device substrate.

The black matrix may extend onto a side of each first touch electrode, a side of each first bridge electrode and a side of each second touch electrode.

Color filters may be disposed between the encapsulating unit and the touch insulating layer. The color filter may overlap the light-emitting devices.

Touch pads may be disposed on the device substrate. The touch pads may be spaced away from the encapsulating unit. The first touch line and the second touch line may be electrically connected to the touch pads through touch routing lines. The touch routing lines may extend along a surface of the encapsulating unit. The black matrix may overlap the touch routing line.

The planar shape of the black matrix between the display area and the touch pads may be the same as the planar shape of the touch routing lines.

Each of the touch pads may include a lower pad electrode and an upper pad electrode on the lower pad electrode. The upper pad electrode may include the same material as the first touch electrodes, the first bridge electrodes and the second touch electrodes. An edge of an upper surface of the upper pad electrode opposite to the device substrate may be covered by the black matrix.

The black matrix may extend onto a side of the upper pad electrode of each touch pad.

A touch passivation layer may be disposed on the black matrix. The touch passivation layer may include pad open holes overlapping with the upper pad electrode of each touch pad. The black matrix may include pad apertures overlapping with the pad open holes.

A side wall of each pad aperture may be continuous with a side wall of the corresponding pad open hole.

In another embodiment, there is provided a touch display apparatus comprising a device substrate. A bank insulating layer is disposed on the device substrate. The bank insulating layer defines emission areas. Light-emitting devices are disposed on the emission areas of the device substrate. An encapsulating layer is disposed on the bank insulating layer and the light-emitting devices. A touch sensor is disposed on the encapsulating unit. The touch sensor includes first touch electrodes and second touch electrodes. The first touch electrodes are connected in a first direction. The second touch electrodes are connected in a second direction perpendicular to the first direction. A black matrix is disposed on the first touch electrodes and the second touch electrodes. The first touch electrodes, the second touch electrodes and the black matrix are disposed between the emission areas. The black matrix includes a gap overlapping with a spaced region between the first touch electrodes and the second touch electrodes.

Color filters may be disposed on the touch sensor. The color filters may overlap the emission areas. The emission areas may include a first emission area and a second emission area. The second emission area may realize a color different from the first emission area. The color filters may include a first color filter on the first emission area and a second color filter on the second emission area. The first color filter and the second color filter may be stacked in the gap of the black matrix.

The planar shape of each of the first touch electrodes, the second touch electrodes and the black matrix may be a mesh shape. A width of the black matrix may be smaller than a width of each first touch electrode and a width of each second touch electrode.

The gap of the black matrix may overlap the bank insulating layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
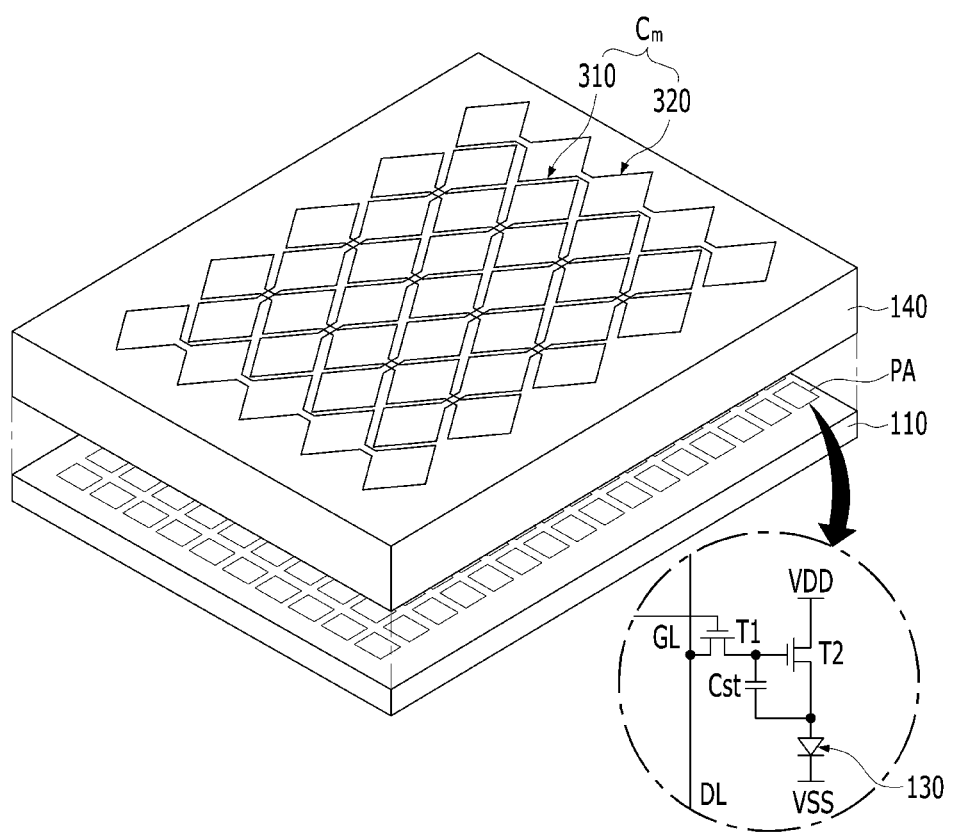
FIGS. 1 and 2 are views schematically showing a touch display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
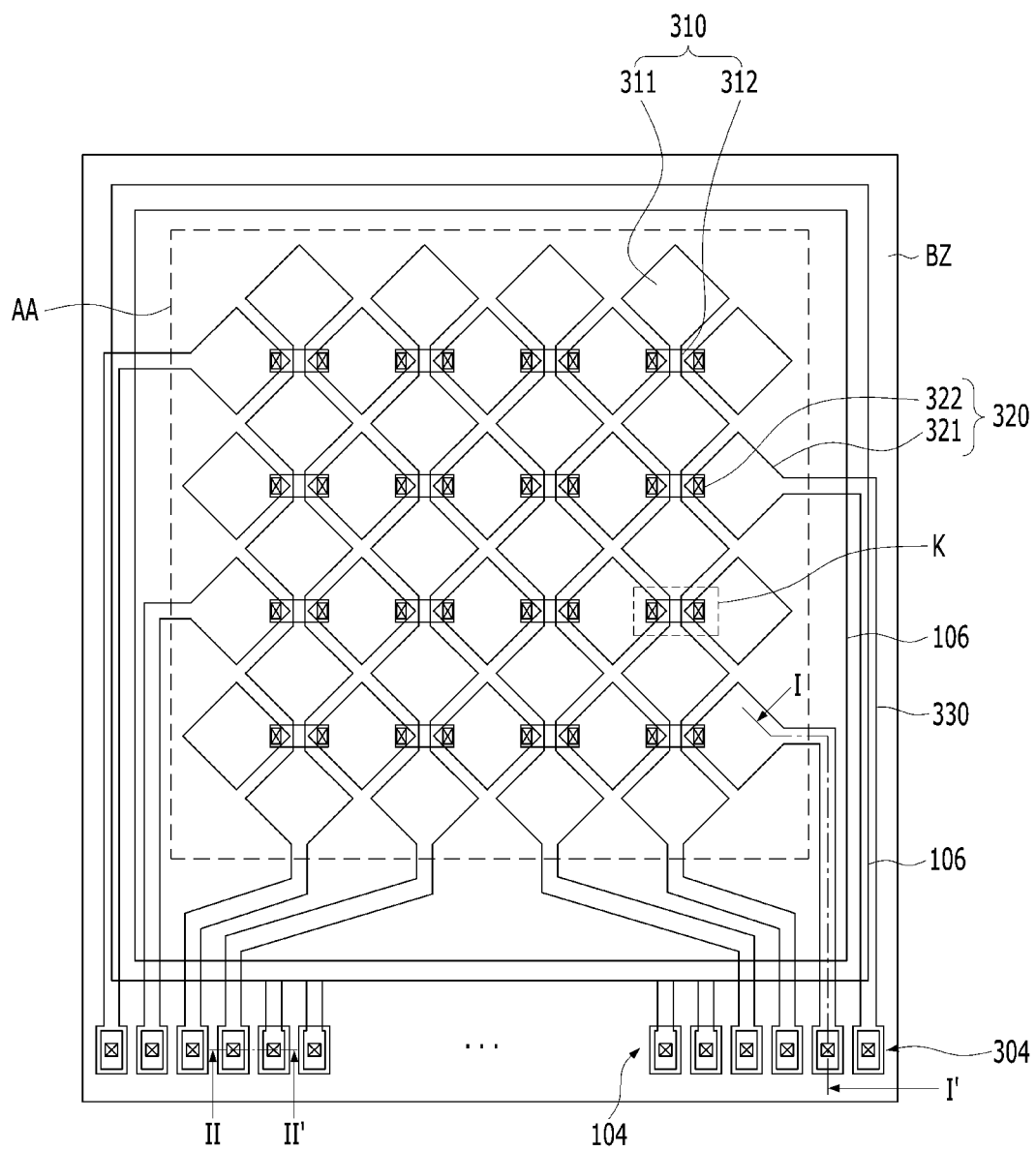
Figure 3:
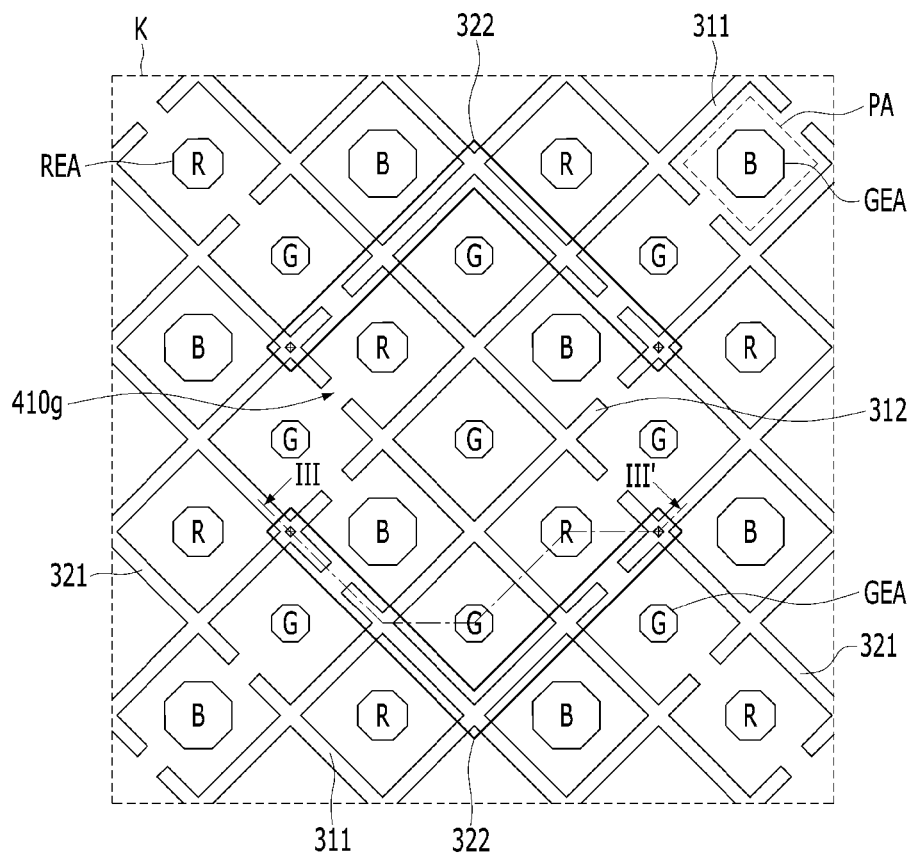
FIG. 3 is an enlarged view of K region in FIG. 2.
Figure 4A:
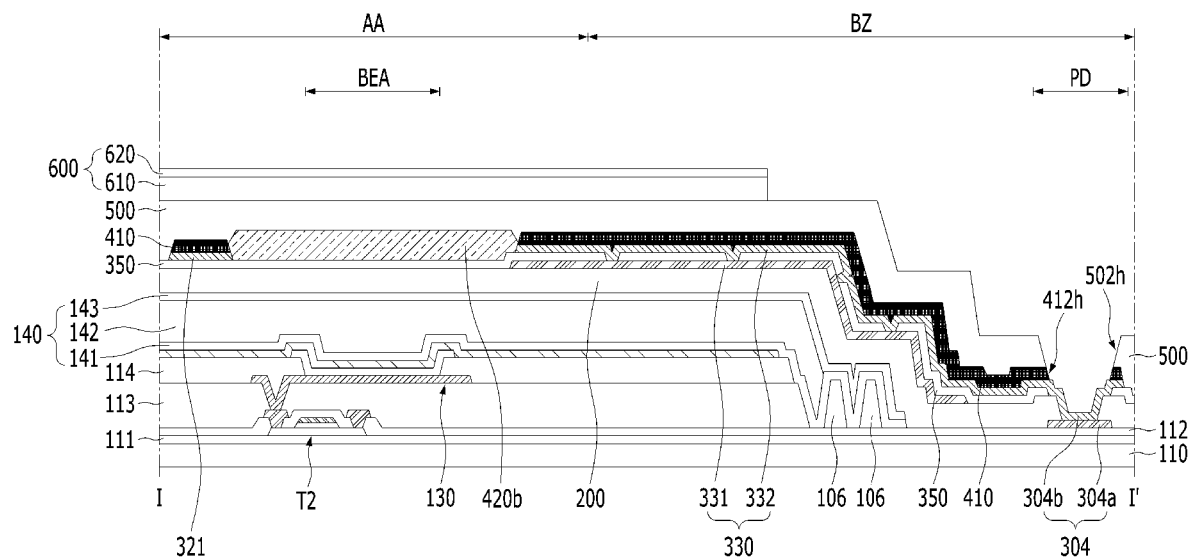
FIG. 4A is a view taken along I-I' of FIG. 2.
Figure 4B:
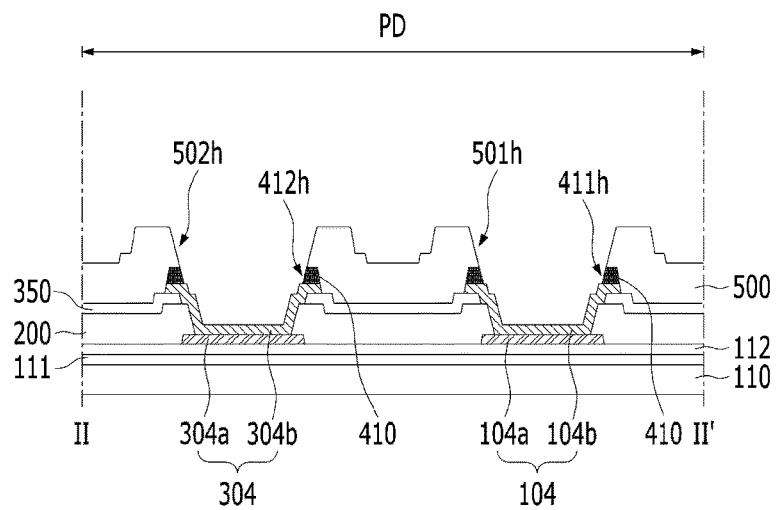
FIG. 4B is a view taken along II-II' of FIG. 2.
Figure 4C:
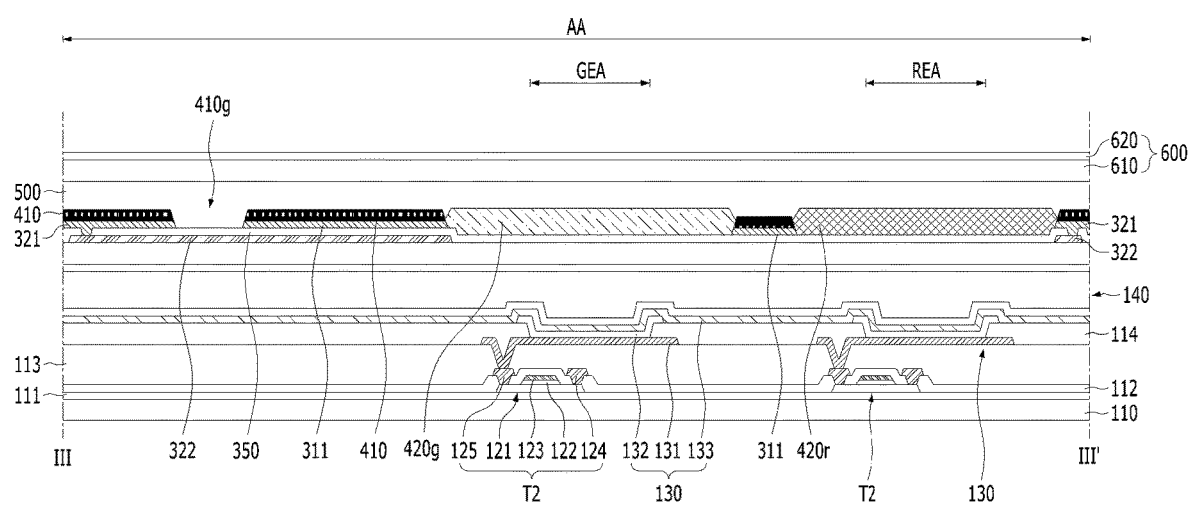
FIG. 4C is a view taken along III-III' of FIG. 3.
Figure 5A:
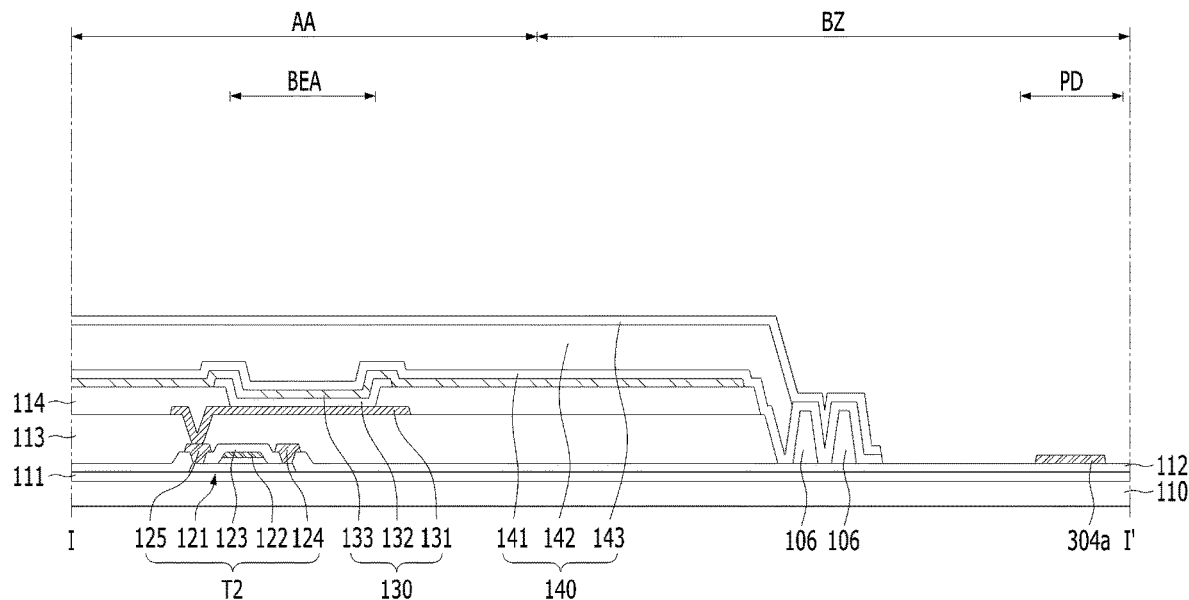
FIGS. 5A to 5C, 6A to 6C, 7A to 7C, 8A to 8C, 9A to 9C, 10A to 10C, and 11A to 11C are views sequentially showing a method of forming the touch display apparatus according to the embodiment of the present disclosure.
Figure 5B:
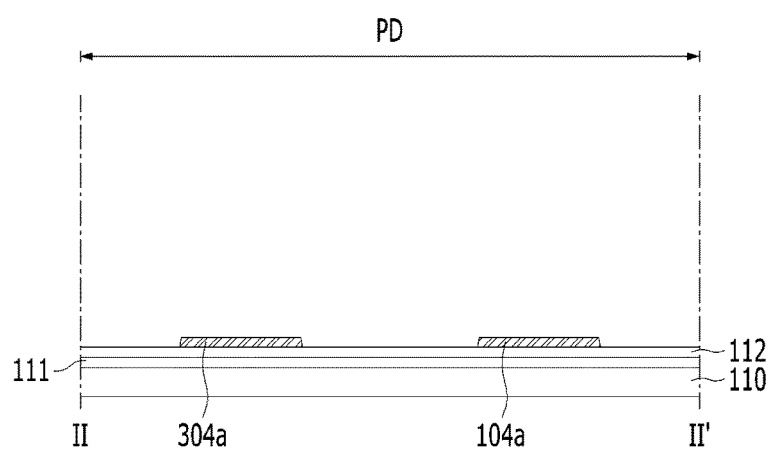
Figure 5C:
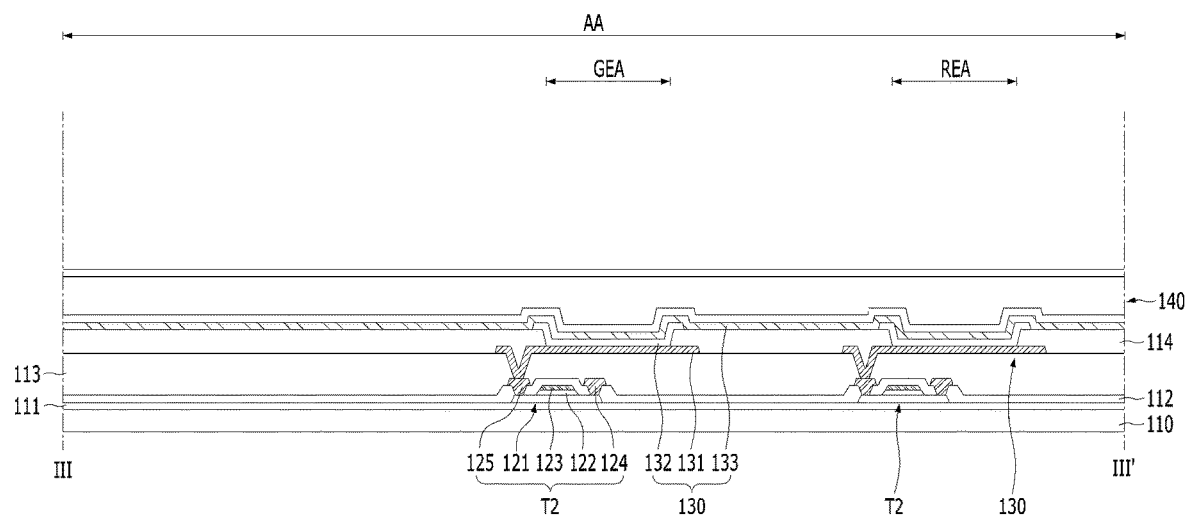

FIGS. 1 and 2 are views schematically showing a touch display apparatus according to an embodiment of the present disclosure. FIG. 3 is an enlarged view of K region in FIG. 2. FIG. 4A is a view taken along I-I' of FIG. 2. FIG. 4B is a view taken along II-II' of FIG. 2. FIG. 4C is a view taken along III-III' of FIG. 3.

Referring to FIGS. 1 to 3 and 4A to 4C, the touch display apparatus according to the embodiment of the present disclosure may include a device substrate 110. The device substrate 110 may include an insulating material. For example, the device substrate 110 may include glass or plastic. The device substrate 110 may include a display area AA and a bezel area BZ disposed outside the display area AA. For example, the bezel area BZ may surround the display area AA.

The display area AA of the device substrate 110 may realize an image provided to a user. For example, a plurality of pixel areas PA may be disposed in the display area AA of the device substrate 110. The pixel areas PA may be disposed side by side in a first direction and a second direction perpendicular to the first direction. Two of the pixel areas PA adjacent in the first direction may be alternately disposed. Two of the pixel areas PA adjacent in the second direction may be alternately disposed. Each of the pixel areas PA may realize a color different from adjacent pixel areas PA. For example, the touch display apparatus according to the embodiment of the present disclosure may include a first row in which red pixel regions R and blue pixel regions B are alternately positioned and a second row in which green pixel regions G are disposed. The touch display apparatus according to the embodiment of the present disclosure may have a pentile structure in which the first row and the second row are alternately repeated.

Each of the pixel areas PA may emit light displaying a specific color. For example, a pixel driving circuit and a light-emitting device 130 electrically connected to the pixel driving circuit may be disposed in each pixel area PA.

The pixel driving circuit may be connected to one of gate lines GL applying a gate signal and one of data lines DL applying a data signal. For example, the pixel driving circuit may generate a driving current corresponding to the data signal according to the scan signal. The driving current generated by the pixel driving circuit may be provided to the light-emitting device 130, during one frame. For example, the pixel driving circuit may include a switching thin film transistor T1, a driving thin film transistor T2 and a storage capacitor Cst.

The switching thin film transistor T1 may provide the data signal to the driving thin film transistor T2 according to the scan signal. The driving thin film transistor T2 may generate the driving current corresponding to the data signal. For example, the driving thin film transistor T2 may include a semiconductor pattern 121, a gate insulating layer 122, a gate electrode 123, a source electrode 124 and a drain electrode 125.

The semiconductor pattern 121 may include a semiconductor material. For example, the semiconductor pattern 121 may include at least one of amorphous silicon, polycrystalline silicon and oxide semiconductor. The semiconductor pattern 121 may include a source region, a drain region and a channel region. The channel region may be disposed between the source region and the drain region. The source region and the drain region may have a lower resistance than the channel region. For example, the source region and the drain region may include a conductorized region of the oxide semiconductor.

The gate insulating layer 122 may be disposed on the semiconductor pattern 121. For example, the gate insulating layer 122 may overlap the channel region of the semiconductor pattern 121. The source region and the drain region of the semiconductor pattern 121 may be disposed outside the gate insulating layer 122. The gate insulating layer 122 may include an insulating material. For example, the gate insulating layer 122 may include an inorganic insulating material, such as silicon oxide (SiO) and silicon nitride (SiN).

The gate electrode 123 may be disposed on the gate insulating layer 122. For example, the gate electrode 123 may overlap the channel region of the semiconductor pattern 121. The gate electrode 123 may be insulated from the semiconductor pattern 121 by the gate insulating layer 122. For example, a side of the gate insulating layer 122 may be continuous with a side of the gate electrode 123. The gate electrode 123 may include a conductive material. For example, the gate electrode 123 may include a metal, such as aluminum (Al), titanium (Ti), copper (Cu), molybdenum (Mo), tantalum (Ta), chromium (Cr) and tungsten (W). The channel region of the semiconductor pattern 121 may have an electric conductivity corresponding to a voltage applied to the gate electrode 123.

The source electrode 124 may include a conductive material. For example, the source electrode 124 may include a metal, such as aluminum (Al), titanium (Ti), copper (Cu), molybdenum (Mo), tantalum (Ta), chromium (Cr) or tungsten (W). The source electrode 124 may be insulated from the gate electrode 123. The source electrode 124 may be disposed on a layer different from the gate electrode 123. For example, an interlayer insulating layer 112 covering the gate electrode 123 may be disposed on the device substrate 110, and the source electrode 124 may be disposed on the interlayer insulating layer 112. The interlayer insulating layer 112 may include an insulating material. For example, the interlayer insulating layer 112 may include an inorganic insulating material, such as silicon oxide (SiO) and silicon nitride (SiN). The source electrode 124 may include a material different from the gate electrode 123.

The source electrode 124 may be electrically connected to the source region of the semiconductor pattern 121. For example, the interlayer insulating layer 112 may include a source contact hole partially exposing the source region of the semiconductor pattern 121. The source electrode 124 may be in direct contact with the source region of the semiconductor pattern 121 through the source contact hole.

The drain electrode 125 may include a conductive material. For example, the drain electrode 125 may include a metal, such as aluminum (Al), titanium (Ti), copper (Cu), molybdenum (Mo), tantalum (Ta), chromium (Cr) or tungsten (W). The drain electrode 125 may be insulated from the gate electrode 123. The drain electrode 125 may be disposed on a layer different from the gate electrode 123. For example, the drain electrode 125 may be disposed on the interlayer insulating layer 112. The drain electrode 125 may be disposed on the same layer as the source electrode 124. The drain electrode 125 may include the same material as the source electrode 124. For example, the drain electrode 125 may be formed simultaneously with the source electrode 124. The drain electrode 125 may include a material different from the gate electrode 123.

The drain electrode 125 may be electrically connected to the drain region of the semiconductor pattern 121. For example, the interlayer insulating layer 112 may include a drain contact hole partially exposing the drain region of the semiconductor pattern 121. The drain electrode 125 may be in direct contact with the drain region of the semiconductor pattern 121 through the drain contact hole.

The switching thin film transistor T1 may have the same structure as the driving thin film transistor T2. For example, the switching thin film transistor T1 may include a gate electrode electrically connected to the corresponding gate line GL, a source electrode electrically connected to the corresponding data line DL, and a drain electrode electrically connected to the gate electrode 123 of the driving thin film transistor T2. The source electrode 124 of the driving thin film transistor T2 may be connected to a first power voltage supply line VDD which supplies a positive power voltage. The storage capacitor Cst may maintain a voltage applied to the gate electrode 123 of the driving thin film transistor T2 during one frame. For example, the storage capacitor Cst may be connected between the gate electrode 123 and the drain electrode 125 of the driving thin film transistor T2.

The light-emitting device 130 may emit light using the driving current supplied from the pixel driving circuit. For example, the light-emitting device 130 may include a first emission electrode 131, a light-emitting stack 132 and a second emission electrode 133, which are sequentially stacked on the device substrate 110.

The first emission electrode 131 may be electrically connected to the drain electrode 125 of the driving thin film transistor T2. For example, the driving current generated by the pixel driving circuit may be supplied to the first emission electrode 131 of the light-emitting device 130. The first emission electrode 131 may include a conductive material. The first emission electrode 131 may include a material having high reflectance. For example, the first emission electrode 131 may include a metal, such as aluminum (Al), titanium (Ti), copper (Cu), molybdenum (Mo), tantalum (Ta), chromium (Cr) or tungsten (W). The first emission electrode 131 may have a multi-layer structure. For example, the first emission electrode 131 may include a structure in which a reflective electrode made of a metal is disposed between transparent electrodes made of a transparent conductive material, such as ITO and IZO.

The light-emitting stack 132 may generate the light having a luminance corresponding to a voltage difference between the first emission electrode 131 and the second emission electrode 133. For example, the light-emitting stack 132 may include an emission material layer (EML) having an emission material. The emission material may include an organic material, an inorganic material or a hybrid material. For example, the touch display apparatus according to the embodiment of the present disclosure may be an organic light-emitting display apparatus including an organic emission material.

The light-emitting stack 132 may have a multi-layer structure. For example, the light-emitting stack 132 may include at least one of a hole injection layer (HIL), a hole transport layer (HTL), an electron transport layer (ETL) and an electron injection layer (EIL). The light-emitting stack 132 may include a plurality of the emission material layers. For example, the light-emitting stack 132 may include a charge generation layer (CGL) between a first emission material layer and a second emission material layer. The second emission material layer may include a material different from the first emission material layer.

The second emission electrode 133 may include a conductive material. The second emission electrode 133 may have a transmittance higher than the first emission electrode 131. For example, the second emission electrode 133 may be a transparent electrode made of a transparent conductive material. The second emission electrode 133 may include a transparent conductive oxide, such as ITO, IZO and AZO. Thus, in the touch display apparatus according to the embodiment of the present disclosure, the light generated by the light-emitting stack 132 of each pixel area PA may be emitted to the outside through the second emission electrode 133 of the corresponding pixel area PA.

A device buffer layer 111 may be disposed between the device substrate 110 and the pixel driving circuit of each pixel area PA. The device buffer layer 111 may prevent pollution due to the device substrate 110 in a process of forming the pixel driving circuits. The device buffer layer 111 may extend onto the bezel area BZ of the device substrate 110. For example, an upper surface of the device substrate 110 toward the pixel driving circuit of each pixel area PA may be completely covered by the device buffer layer 111. The device buffer layer 111 may include an insulating material. For example, the device buffer layer 111 may include an inorganic insulating material, such as silicon oxide (SiO) and silicon nitride (SiN). The device buffer layer 111 may have a multi-layer structure. For example, the device buffer layer 111 may have a stacked structure of an inorganic insulating layer made of silicon oxide (SiO) and an inorganic insulating layer made of silicon nitride (SiN).

A planarization layer 113 may be disposed between the pixel driving circuit and the light-emitting device 130 of each pixel area PA. The planarization layer 113 may remove a thickness difference due to the pixel driving circuit of each pixel area PA. For example, an upper surface of the planarization layer 113 opposite to the device substrate 110 may be a flat surface. The switching thin film transistor T1, the driving thin film transistor T2 and the storage capacitor Cst in each pixel area PA may be covered by the planarization layer 113. The planarization layer 113 may include an insulating material. The planarization layer 113 may include a material different from the interlayer insulating layer 112. For example, the planarization layer 113 may include an organic insulating material.

The first emission electrode 131 of each pixel area PA may be electrically connected to the pixel driving circuit of the corresponding pixel area PA by penetrating the planarization layer 113. For example, the planarization layer 113 may include pixel contact holes partially exposing the drain electrode 125 of the driving thin film transistor T2 in each pixel area PA. The first emission electrode 131 of each pixel area PA may be in direct contact with the drain electrode 125 of the driving thin film transistor T2 in the corresponding pixel area PA through one of the pixel contact holes.

The first emission electrode 131 of each pixel area PA may be insulated from the first emission electrode 131 of adjacent pixel area PA. The first emission electrode 131 of each pixel area PA may be spaced away from the first emission electrode 131 of adjacent pixel area PA. For example, a bank insulating layer 114 may be disposed between the first emission electrodes 131 of adjacent pixel areas PA. The bank insulating layer 114 may include an insulating material. For example, the bank insulating layer 114 may include an organic insulating material. The bank insulating layer 114 may cover an edge of the first emission electrode 131 in each pixel area PA. The light-emitting stack 132 and the second emission electrode 133 of each pixel area PA may be stacked on a portion of the corresponding first emission electrode 131 exposed by the bank insulating layer 114. For example, the bank insulating layer 114 may define an emission area BEA, GEA and REA in each pixel area PA.

The light-emitting device 130 of each pixel area PA may have the same structure as the light-emitting device 130 of adjacent pixel area PA. For example, the light-emitting stack 132 of each pixel area PA may be connected to the light-emitting stack 132 of adjacent pixel area PA by extending along a surface of the bank insulating layer 114. The light emitted from the light-emitting device 130 of each pixel area PA may display the same color as the light emitted from the light-emitting device 130 of adjacent pixel area PA. For example, the light-emitting stack 132 of each pixel area PA may generate white light. The light-emitting stack 132 of each pixel area PA may be formed simultaneously with the light-emitting stack 132 of adjacent pixel area PA. Thus, in the touch display apparatus according to the embodiment of the present disclosure, a process of forming the light-emitting stack 132 on each pixel area PA may be simplified.

A voltage applied to the second emission electrode 133 of each pixel area PA may be the same as a voltage applied to the second emission electrode 133 of adjacent pixel area PA. For example, the second emission electrode 133 of each pixel area PA may be electrically connected to a second power voltage supply line VSS which supplies a negative power voltage. Thus, in the touch display apparatus according to the embodiment of the present disclosure, the luminance of the light emitted from the light-emitting device 130 of each pixel area PA may be adjusted by the data signal applied to the corresponding pixel area PA. The second emission electrode 133 of each pixel area PA may be electrically connected to the second emission electrode 133 of adjacent pixel area PA. For example, the second emission electrode 133 of each pixel area PA may be in direct contact with the second emission electrode 133 of adjacent pixel area PA. The second emission electrode 133 of each pixel area PA may be formed simultaneously with the second emission electrode 133 of adjacent pixel area PA. Therefore, in the touch display apparatus according to the embodiment of the present disclosure, a process of forming the second emission electrode 133 on each pixel area PA may be simplified.

An encapsulating unit 140 may be disposed on the light-emitting device 130 of each pixel area PA. The encapsulating unit 140 may prevent or at least reduce the damage of the light-emitting devices 130 due to external moisture and/or oxygen. The light-emitting device 130 of each pixel area PA may be completely covered by the encapsulating unit 140. For example, the encapsulating unit 140 may extend onto the bezel area BZ of the device substrate 110.

The encapsulating unit 140 may include at least one inorganic encapsulating layer 141 and 143 and at least one organic encapsulating layer 142. For example, the encapsulating unit 140 may have a structure in which at least one organic encapsulating layer 142 is disposed between inorganic encapsulating layers 141 and 143. The uppermost layer of the encapsulating unit 140 may be the inorganic encapsulating layers 141 and 143. For example, an upper surface and a side of the organic encapsulating layer 142 may be covered by the inorganic encapsulating layers 141 and 143. Thus, in the touch display apparatus according to the embodiment of the present disclosure, the penetration of the external moisture and oxygen may be effectively blocked.

The inorganic encapsulating layers 141 and 143 may include an inorganic insulating material. For example, the inorganic encapsulating layers 141 and 143 may include an inorganic insulating material capable of low-temperature deposition, such as silicon nitride (SiN), silicon oxide (SiO), silicon oxy-nitride (SiON) and aluminum oxide (Al2O3). Thus, in the touch display apparatus according to the embodiment of the present disclosure, the damage of the light-emitting stacks 132 due to a process of forming the inorganic encapsulating layers 141 and 143 may be prevented or at least reduced.

The organic encapsulating layer 142 may relieve stress due to the inorganic encapsulating layer 141 and 143. For example, the organic encapsulating layer 142 may include an organic insulating material, such as acryl resin, epoxy resin, poly-imide, poly-ethylene and silicon oxy-carbide (SiOC). A thickness difference due to the light-emitting devices 130 may be removed by the organic encapsulating layer 142. For example, an upper surface of the organic encapsulating layer 142 opposite to the device substrate 110 may be a flat surface.

The organic encapsulating layer 142 may be formed by an ink-jet method. For example, at least one dam 106 may be disposed on the bezel area BZ of the device substrate 110. The dam 106 may block the flow of the organic encapsulating layer 142. The dam 106 may extend along an edge of the display area AA. For example, in the touch display apparatus according to the embodiment of the present disclosure, the organic encapsulating layer 142 may be formed in a region defined by the dam 106. The dam 106 may be formed using a process of forming at least one of insulating layers, which are disposed between the device substrate 110 and the encapsulating unit 140. For example, the dam 106 may be formed simultaneously with the planarization layer 113. The dam 106 may include the same material as the planarization layer 113. For example, the dam 106 may include an organic insulating material. The interlayer insulating layer 112 may extend onto the bezel area BZ of the device substrate 110. For example, the dam 106 may be disposed on the interlayer insulating layer 112. A thickness of the dam 106 may be the same as a thickness of the planarization layer 113.

A touch sensor Cm may be disposed on the encapsulating unit 140. The touch sensor Cm may sense the touch of the user and/or the tool. For example, the touch sensor Cm may detect the presence or the absence of the touch and the location of the touch through a change in mutual capacitance. The touch sensor Cm may include a first touch line 310 and a second touch line 320.

A touch driving signal may be applied to the first touch line 310. For example, the first touch line 310 may function as a touch driving line. The first touch line 310 may include first touch electrodes 311 and first bridge electrodes 312. The first touch electrodes 311 may be disposed side by side on the encapsulating unit 140. The first bridge electrodes 312 may be electrically connected between the first touch electrodes 311. Each of the first bridge electrodes 312 may extend in a first direction. For example, each of the first touch electrodes 311 may be connected to adjacent first touch electrodes 311 in the first direction by one of the first bridge electrodes 312.

The first touch electrodes 311 may include a conductive material. For example, the first touch electrodes 311 may include a material having a relatively low resistance. For example, the first touch electrodes 311 may include a metal, such as titanium (Ti), copper (Cu), molybdenum (Mo) and tantalum (Ta). Each of the first touch electrodes 311 may have a multi-layer structure. For example, the first touch electrodes 311 may have a three-layer structure, such as Ti/Al/Ti, MoTi/Cu/MoTi and Ti/Al/Mo.

The first bridge electrodes 312 may include a conductive material. The first bridge electrodes 312 may include a material having a relatively low resistance. For example, the first bridge electrodes 312 may include a metal, such as titanium (Ti), copper (Cu), molybdenum (Mo) and tantalum (Ta). The first bridge electrodes 312 may include the same material as the first touch electrodes 311. Each of the first bridge electrodes 312 may have a multi-layer structure. For example, the first bridge electrodes 312 may have a three-layer structure, such as Ti/Al/Ti, MoTi/Cu/MoTi and Ti/Al/Mo. The first bridge electrodes 312 may have the same structure as the first touch electrodes 311. The first bridge electrodes 312 may be disposed on the same layer as the first touch electrode 311. For example, each of the first bridge electrodes 312 may be in direct contact with the first touch electrodes 311.

The second touch line 320 may include second touch electrodes 321 and second bridge electrodes 322. The second touch electrodes 321 may be disposed side by side on the encapsulating unit 140. The second touch electrodes 321 may be disposed on the same layer as the first touch electrodes 311. The second touch electrodes 321 may be insulated from the first touch electrodes 311. For example, the second touch electrodes 321 may be disposed between the first touch electrodes 311. The second touch electrodes 321 may have the same shape as the first touch electrodes 311. For example, the first touch electrodes 311 and the second touch electrodes 321 may be disposed on the encapsulating unit 140, alternately. Thus, in the touch display apparatus according to the embodiment of the present disclosure, charges charged by the touch driving signal may be discharged through the second touch line 320. Therefore, the touch display apparatus according to the embodiment of the present disclosure may detect the touch of the user and/or the tool and the location of the touch using the touch sensor Cm.

The second touch electrodes 321 may include a conductive material. The second touch electrodes 321 may include a material having a relatively low resistance. For example, the second touch electrodes 321 may include a metal, such as titanium (Ti), copper (Cu), molybdenum (Mo) and tantalum (Ta). Each of the second touch electrodes 321 may have a multi-layer structure. For example, the second touch electrodes 321 may have a three-layer structure, such as Ti/Al/Ti, MoTi/Cu/MoTi and Ti/Al/Mo.

The second touch electrodes 321 may be disposed on the same layer as the first touch electrodes 311 and the first bridge electrodes 312. The second touch electrodes 321 may be insulated from the first bridge electrodes 312. The second touch electrodes 321 may be spaced away from the first bridge electrodes 312. For example, the first bridge electrodes 312 may cross between the second touch electrodes 321.

The second bridge electrodes 322 may be electrically connected between the second touch electrodes 321. Each of the second bridge electrodes 322 may extend in a second direction. For example, each of the second touch electrodes 321 may be connected to adjacent second touch electrodes 321 in the second direction by one of the second bridge electrodes 322. The second direction may be different from the first direction. For example, the second direction may be perpendicular to the first direction. The second bridge electrodes 322 may cross between the first touch electrodes 311. For example, each of the second bridge electrodes 322 may cross one of the first bridge electrodes 311. The second bridge electrodes 322 may be insulated from the first bridge electrodes 312. The second bridge electrodes 322 may be disposed on a layer different from the first bridge electrodes 312. For example, the touch sensor Cm may include a touch insulating layer 350 disposed on the second bridge electrodes 322, and the first touch electrodes 311, the first bridge electrodes 312 and the second touch electrodes 322 may be disposed on the touch insulating layer 350.

The touch insulating layer 350 may include an insulating material. For example, the touch insulating layer 350 may include an inorganic insulating material, such as silicon oxide (SiO) and silicon nitride (SiN). The touch insulating layer 350 may include touch contact holes partially exposing each second bridge electrode 322. Each of the second touch electrodes 321 may be connected to the corresponding second bridge electrode 322 through one of the touch contact holes.

The second bridge electrodes 322 may include a conductive material. The second bridge electrodes 322 may include a material having a relative low resistance. For example, the second bridge electrodes 322 may include a metal, such as titanium (Ti), copper (Cu), molybdenum (Mo) and tantalum (Ta). Each of the second bridge electrodes 322 may have a multi-layer structure. For example, the second bridge electrodes 322 may have a three-layer structure, such as Ti/Al/Ti, MoTi/Cu/MoTi and Ti/Al/Mo.

The first touch electrodes 311, the first bridge electrodes 312, the second touch electrodes 321 and the second bridge electrodes 322 of the touch sensor Cm may be disposed in the display area AA of the device substrate 110. The emission area BEA, GEA and REA of each pixel area PA may be disposed among the first touch electrodes 311, the first bridge electrodes 312, the second touch electrodes 321 and the second bridge electrodes 322. The first touch line 310 and the second touch line 320 may be disposed outside the light-emitting devices 130. For example, the first touch electrodes 311, the first bridge electrodes 312, the second touch electrodes 321 and the second bridge electrodes 322 may overlap the bank insulating layer 114. The planar shape of each first touch electrode 311 and the planar shape of each second touch electrode 321 may be a mesh shape including openings overlapping with the emission area BEA, GEA and REA of each pixel area PA. Thus, in the touch display apparatus according to the embodiment of the present disclosure, the accuracy of touch sensing using the touch sensor Cm may be improved, and the decrease in light-extraction efficiency due to the first touch electrodes 311, the first bridge electrodes 312, the second touch electrodes 321 and the second bridge electrodes 322 of the touch sensor Cm may be reduced.

A touch buffer layer 200 may be disposed between the encapsulating unit 140 and the touch sensor Cm. For example, the second bridge electrodes 322 may be disposed between the touch buffer layer 200 and the touch insulating layer 350. The touch buffer layer 200 may reduce the parasitic capacitance generated between the second emission electrode 133 of each light-emitting device 130 and the touch sensor Cm. For example, the distance between the first touch line 310 of the touch sensor Cm and the second emission electrode 133 of each light-emitting device 130 and a distance between the second touch line 320 of the touch sensor Cm and the second emission electrode 133 of each light-emitting device 130 may be increased by the touch buffer layer 200. Thus, in the touch display apparatus according to the embodiment of the present disclosure, the accuracy of the touch sensing of the touch sensor Cm may be improved. The touch buffer layer 200 may include an insulating material. For example, the touch buffer layer 200 may include an inorganic insulating material, such as silicon oxide (SiO) and silicon nitride (SiN).

A black matrix 410 may be disposed on the first touch electrodes 311, the first bridge electrodes 312 and the second touch electrodes 321 of the touch sensor Cm. The black matrix 410 may overlap the first touch electrodes 311, the first bridge electrodes 312 and the second touch electrodes 321. For example, an upper surface of each first touch electrode 311, an upper surface of each first bridge electrode 312 and an upper surface of each second touch electrode 321, which are opposite to the device substrate 110 may be covered by the black matrix 410. The black matrix 410 may be in direct contact with the upper surface of each first touch electrode 311, the upper surface of each first bridge electrode 312 and the upper surface of each second touch electrode 321. The planar shape of the black matrix 410 in the display area AA of the device substrate 110 may be the same as the planar shape by the first touch electrodes 311, the first bridge electrodes 312 and the second touch electrodes 321. For example, a side of the black matrix 410 may be continuous with a side of each first touch electrode 311, a side of each first bridge electrode 312 and a side of each second touch electrode 321. The black matrix 410 may be disposed outside the light-emitting devices 130. For example, the planar shape of the black matrix 410 may be a mesh shape. The black matrix 410 may include a gap 410g overlapping with a spaced region between the first touch electrodes 311 and the second touch electrodes 321.

The black matrix 410 may block light. Thus, in the touch display apparatus according to the embodiment of the present disclosure, external light travelling toward the first touch electrodes 311, the first bridge electrodes 312 and the second touch electrodes 321 may be blocked by the black matrix 410. Therefore, in the touch display apparatus according to the embodiment of the present disclosure, the reflection of external light by the first touch electrodes 311, the first bridge electrodes 312 and the second touch electrodes 321 of the touch sensor Cm may be prevented or at least reduced.

Color filters 420b, 420g and 420r overlapping with the emission areas BEA, GEA and REA may be disposed on the encapsulating unit 140. The color filters 420b, 420g and 420r may overlap the light-emitting device 130. For example, light generated by each light-emitting device 130 may be emitted to the outside through one of the color filters 420b, 420g and 420r. Each of the color filters 420b, 420g, 420r may include a material different from adjacent color filter 420b, 420g and 420r. For example, blue color filters 420b may be disposed on blue emission areas BEA of blue pixel areas B, green color filters 420g may be disposed on green emission areas GEA of green pixel areas G, and red color filters 420r may be disposed on red emission areas REA of red pixel areas R. Thus, the touch display apparatus according to the embodiment of the present disclosure may provide the image made of various colors to the user using white color emitted from the light-emitting device 130 of each pixel area PA and the color filters 420b, 420g and 420r.

The color filters 420b, 420g and 420r may be disposed in the openings of the first touch electrodes 311 and the second touch electrodes 321, which have a mesh shape. For example, the black matrix 410 may surround the color filters 420b, 420g and 420r. Thus, in the touch display apparatus according to the embodiment of the present disclosure, the external light which is not blocked by the black matrix 410 may be irradiated to the light-emitting devices 130 through one of the color filters 420b, 420g and 420r. And, in the touch display apparatus according to the embodiment of the present disclosure, the external light reflected by the first emission electrode 131 of each light-emitting device 130 may be emitted to the outside through the color filter 420b, 420g and 420r overlapping with the corresponding light-emitting device 130. That is, in the touch display apparatus according to the embodiment of the present disclosure, the external light reflected by the first emission electrode 131 of each light-emitting device 130 may display the same color as the light emitted from the corresponding light-emitting device 130. Therefore, in the touch display apparatus according to the embodiment of the present disclosure, the deterioration of the image due to the reflection of the external light may be prevented or at least reduced, without using a polarizing plate.

A touch passivation layer 500 may be disposed on the black matrix 410 and the color filters 420b, 420g and 420r. The touch passivation layer 500 may prevent or at least reduce the damage of the touch sensor Cm, the black matrix 410 and the color filters 420b, 420g and 420r due to the external impact and/or moisture. The touch passivation layer 500 may extend beyond the display area AA. For example, the first touch electrodes 311, the first bridge electrodes 312, the second touch electrodes 321, the black matrix 410 and the color filters 420b, 420g and 420r may be completely covered by the touch passivation layer 500. The touch passivation layer 500 may include an insulating material. The touch passivation layer 500 may include a material different from the touch insulating layer 350. For example, the touch passivation layer 500 may include an organic insulating material. A thickness difference due to the first touch line 310, the second touch line 320, the black matrix 410 and the color filters 420b, 420g and 420r may be removed by the touch passivation layer 500.

A cover element 600 may be disposed on the touch passivation layer 500. The cover element 600 may prevent or at least reduce damage due to external impact. The cover element 600 may be in direct contact with the touch passivation layer 500. For example, the cover element 600 may include a cover adhesive layer 610 and a cover window 620.

The cover adhesive layer 610 may include an adhesive material. The cover adhesive layer 610 may include a transparent material. For example, the cover adhesive layer 610 may include an optical clear adhesive (OCA). The cover adhesive layer 610 may relieve the reflection of external light. For example, the cover adhesive layer 610 may include a dye.

The cover window 620 may be attached to the touch passivation layer 500 by the cover adhesive layer 610. The cover window 620 may include a transparent material. The cover window 620 may have a hardness greater than or equal to a specific level. For example, the cover window 620 may include glass or plastic.

Various signals to realize the image may be applied to each pixel area PA through the bezel area BZ of the device substrate 110. For example, the bezel area BZ of the device substrate 110 may include a pad area PD in which display pads 104 and touch pads 304 are disposed. The dam 106 may be disposed between the display area AA and the pad area PD. For example, the display pads 104 and the touch pads 304 may be spaced away from the encapsulating unit 140. Thus, in the touch display apparatus according to the embodiment of the present disclosure, a portion of the display pads 104 and the touch pads 304 may be prevented from being unintentionally covered by the organic encapsulating layer 142. Therefore, in the touch display apparatus according to the embodiment of the present disclosure, the distortion of the signal transmitted through the display pads 104 and the touch pads 304 may be prevented.

The gate lines GL and/or the data lines DL may be electrically connected to the display pads 104. For example, the data signal applied to each pixel area PA may be transmitted by one of the display pads 104 and one of the data lines DL. Each of the display pads 104 may include a first lower pad electrode 104a and a first upper pad electrode 104b on the first lower pad electrode 104a. The display pads 104 may be formed using a process of forming the pixel driving circuits, the light-emitting devices 130 and the touch sensor Cm. For example, the first lower pad electrode 104a may include the same material as the source electrode 124 and the drain electrode 125 of each pixel driving circuit, and the first upper pad electrode 104b may include the same material as the first touch electrodes 311, the first bridge electrodes 312 and the second touch electrodes 321.

The touch pads 304 may be disposed side by side with the display pads 104. For example, the pad area PD may be disposed on a side of the display area AA. The touch pads 304 may have the same structure as the display pads 104. For example, each of the touch pads 304 may include a second lower pad electrode 304a and a second upper pad electrode 304b on the second lower pad electrode 304a. The touch pads 304 may be formed simultaneously with the display pads 104. For example, the second lower pad electrode 304a may include the same material as the first lower pad electrode 104a, and the second upper pad electrode 304b may include the same material as the first upper pad electrode 104b.

The touch pads 304 may be electrically connected to the first touch line 310 and the second touch line 320 through touch routing lines 330. For example, the touch driving signal may be applied to the first touch line 310 through one of the touch pads 304 and one of the touch routing lines 330, the charges charged by the touch driving signal may be discharged through the second touch line 320, one of the touch routing lines 330 and one of the touch pads 304.

The touch routing lines 330 may be formed using a process of forming the touch sensor Cm. For example, each of the touch routing lines 330 may have a stacked structure of a lower routing line 331 including the same material as the second bridge electrodes 322 and an upper routing line 332 including the same material as the first bridge electrodes 312. The upper routing line 332 of each touch routing line 330 may be electrically connected to the lower routing line 331 of the corresponding touch routing line 330. For example, the touch insulating layer 350 may include routing contact holes partially exposing the lower routing line 331 of each touch routing line 330. The upper routing line 332 of each touch routing line 330 may be in direct contact with the lower routing line 331 of the corresponding touch routing line 330 through the routing contact holes. Thus, in the touch display apparatus according to the embodiment of the present disclosure, the first touch line 310 and the second touch line 320 may be stably connected to the corresponding touch pad 304 by the touch routing lines 330. And, in the touch display apparatus according to the embodiment of the present disclosure, the resistance of each touch routing line 330 may be reduced. Therefore, in the touch display apparatus according to the embodiment of the present disclosure, a signal delay caused by the touch routing lines 330 may be minimized.

The device buffer layer 111, the interlayer insulating layer 112, the touch buffer layer 200, the touch insulating layer 350, the black matrix 410 and the touch passivation layer 500 may extend onto the pad area PD of the device substrate 110. For example, the first lower pad electrode 104a and the second lower pad electrode 304a may be disposed on the interlayer insulating layer 112, and the touch buffer layer 200 and the touch insulating layer 350 may include pad contact holes partially exposing the first lower pad electrode 104a of each display pad 104 and the second lower pad electrode 304a of each touch pad 304. The first upper pad electrode 104b of each display pad 104 may be electrically connected to the first lower pad electrode 104a of the corresponding display pad 104 by one of the pad contact holes, and the second upper pad electrode 304b of each touch pad 304 may be electrically connected to the second lower pad electrode 304a of the corresponding touch pad 304 by one of the pad contact holes.

The black matrix 410 may overlap the touch routing lines 330. For example, an upper surface of each touch routing line 330 opposite to the device substrate 110 may be covered by the black matrix 410. The black matrix 410 may extend parallel to the touch routing lines 330. For example, the planar shape of the black matrix 410 between the display area AA and the pad area PD may be the same as the planar shape of the touch routing lines 330. The black matrix 410 may be in direct contact with the touch routing lines 330. For example, a side of the upper routing line 332 of each touch routing line 330 may be continuous with the side of the black matrix 410.

The touch passivation layer 500 may include first pad open holes 501h overlapping with a center region of the first upper pad electrode 104b of each display pad 104 and second pad open holes 502h overlapping with a center region of the second upper pad electrode 304b of each touch pad 304. The black matrix 410 may include first pad apertures 411h overlapping with the first pad open holes 501h and second pad apertures 412h overlapping with the second pad open holes 502h. For example, the first upper pad electrode 104b of each display pad 104 may be partially exposed by one of the first pad apertures 411h and one of the first pad open holes 501h, and the second upper pad electrode 304b of each touch pad 304 may be partially exposed by one of the second pad apertures 412h and one of the second pad open holes 502h. Each of the first upper pad electrodes 104b and the second upper pad electrodes 304b may include an upper surface opposite to the device substrate 110, and the black matrix 410 and the touch passivation layer 500 may be stacked on an edge of the upper surface of the first upper pad electrode 104b of each display pad 104 and an edge of the upper surface of the second upper pad electrode 304b of each touch pad 304. The black matrix 410 may include a material having greater adhesion to the first upper pad electrode 104b and the second upper pad electrode 304b than the touch passivation layer 500. Thus, in the touch display apparatus according to the embodiment of the present disclosure, peeling of the touch passivation layer 500 covering the edge of the first upper pad electrode 104b of each display pad 104 and the edge of the second upper pad electrode 304b of each touch pad 304 may be prevented by the black matrix 410. Therefore, in the touch display apparatus according to the embodiment of the present disclosure, the penetration of the external moisture through the edge of the first upper pad electrode 104b of each display pad 104 and the edge of the second upper pad electrode 304b of each touch pad 304 may be prevented.

FIGS. 5A to 5C, 6A to 6C, 7A to 7C, 8A to 8C, 9A to 9C, 10A to 10C, and 11A to 11C are views sequentially showing a method of forming the touch display apparatus according to the embodiment of the present disclosure.

A method of forming the touch display apparatus according to the embodiment of the present disclosure will be described with reference to FIGS. 1 to 3, 4A to 4C, 5A to 5C, 6A to 6C, 7A to 7C, 8A to 8C, 9A to 9C, 10A to 10C, and 11A to 11C. First, the method of forming the touch display apparatus according to the embodiment of the present disclosure may include a step of forming a pixel driving circuit including a driving thin film transistor T2, at least one dam 106, a device buffer layer 111, an interlayer insulating layer 112, a planarization layer 113, a bank insulating layer 114, a light-emitting device 130, a first lower pad electrode 104a and a second lower pad electrode 304a on a device substrate 110, and a step of forming an encapsulating unit 140 on the pixel driving circuits and the light-emitting device 130.

The device substrate 110 may include a display area AA and a bezel area BZ disposed outside the display area AA. The bank insulating layer 114 may define emission areas BEA, GEA and REA in the display area AA. The bezel area BZ may include a pad area PD. The pixel driving circuits and the light-emitting devices 130 may be formed on the display area AA of the device substrate 110. The first lower pad electrode 104a and the second lower pad electrode 304a may be formed in the pad area PD. The device buffer layer 111 and the interlayer insulating layer 112 may extend onto the bezel area BZ of the device substrate 110. For example, the first lower pad electrode 104a and the second lower pad electrode 304a may be formed on the interlayer insulating layer 112. The first lower pad electrode 104a and the second lower pad electrode 304a may be formed using a process of forming the pixel driving circuits. For example, the first lower pad electrode 104a and the second lower pad electrode 304a may be formed simultaneously with the source electrode 124 and the drain electrode 125 of the driving thin film transistor T2 of each pixel driving circuit.

The encapsulating unit 140 may be formed in a region defined by the dam 106. The dam 106 may be formed between the display area AA and the pad area PD. For example, the first lower pad electrode 104a and the second lower pad electrode 304a formed in the pad area PD may be spaced away from the encapsulating unit 140.

Figure 6A:
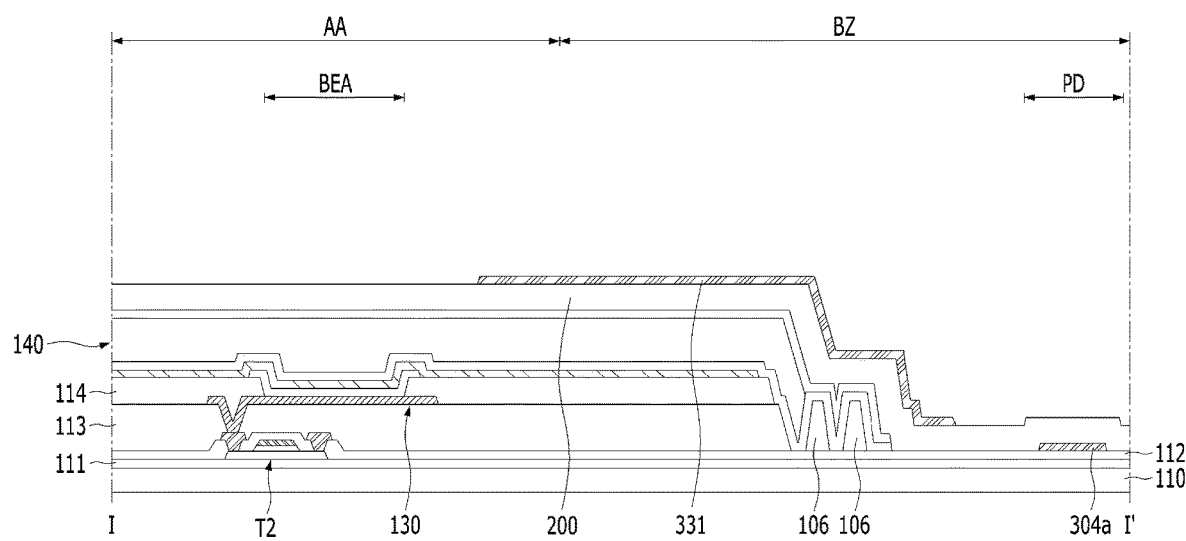
Figure 6B:
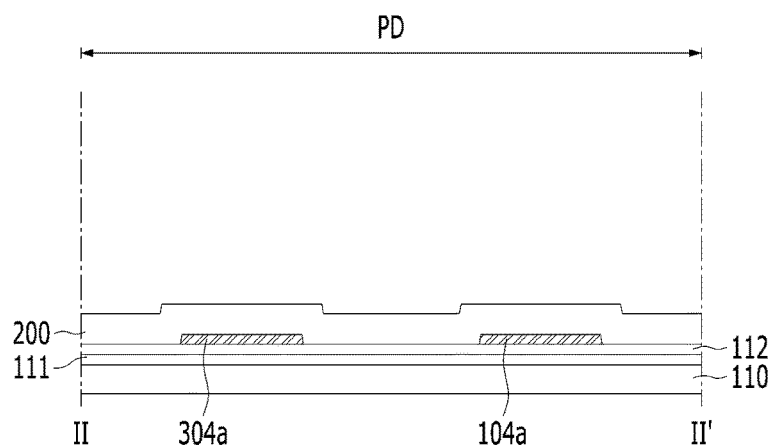
Figure 6C:
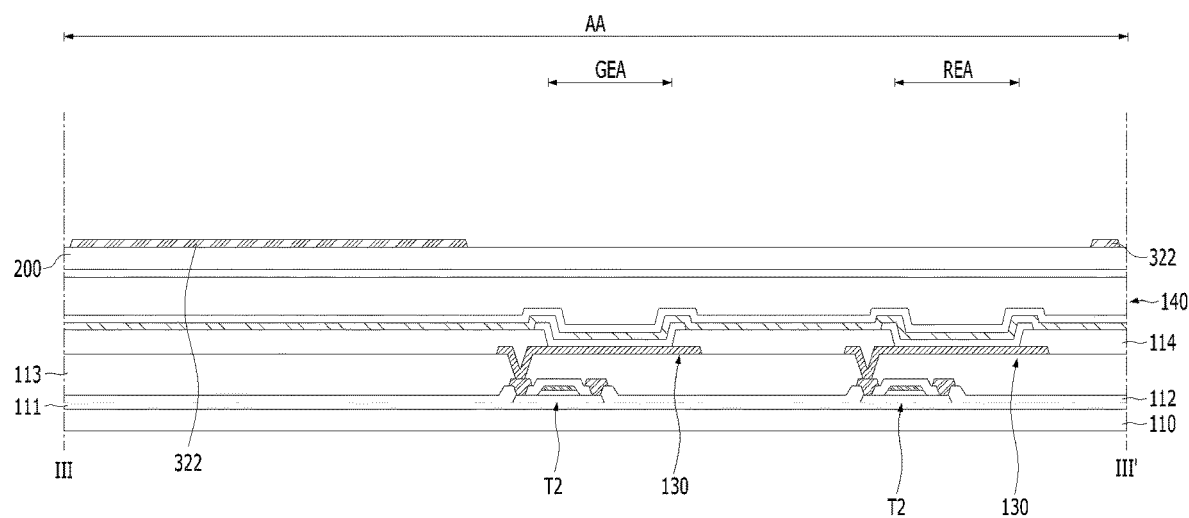

As shown in FIGS. 6A to 6C, the method of forming the touch display apparatus according to the embodiment of the present disclosure may include a step of forming a touch buffer layer 200 on the device substrate 110 in which the encapsulating unit 140, the first lower pad electrode 104a and the second lower pad electrode 304a are formed, and a step of forming second bridge electrodes 322 and lower routing lines 331 on the touch buffer layer 200.

The touch buffer layer 200 may cover the first lower pad electrode 104a and the second lower pad electrode 304a. For example, the step of forming the touch buffer layer 200 may include a step of depositing an inorganic insulating material on the entire surface of the device substrate 110 in which the encapsulating unit 140, the first lower pad electrode 104a and the second lower pad electrode 304a are formed.

The second bridge electrodes 322 may be formed on the display area AA of the device substrate 110. The second bridge electrodes 322 may be formed outside the emission areas BEA, GEA and REA. For example, the second bridge electrodes 322 may overlap the bank insulating layer 114. The lower routing lines 331 may be formed between the display area AA and the second bridge electrodes 322. The lower routing lines 331 may be formed simultaneously with the second bridge electrodes 322. For example, a step of forming the second bridge electrodes 322 and the lower routing lines 331 may include a step of forming a conductive material layer on the touch buffer layer 200 and a step of patterning the conductive material layer. The lower routing lines 331 may include the same material as the second bridge electrodes 322.

The lower routing lines 331 and the second bridge electrodes 322 may be formed of a metal, such as titanium (Ti), copper (Cu), molybdenum (Mo) and tantalum (Ta). The lower routing lines 331 and the second bridge electrodes 322 may have a multi-layer structure. For example, the lower routing lines 331 and the second bridge electrodes 322 may have a three-layer structure, such as Ti/Al/Ti, MoTi/Cu/MoTi and Ti/Al/Mo. The lower routing lines 331 may have a stacked structure same as the second bridge electrodes 322.

Figure 7A:
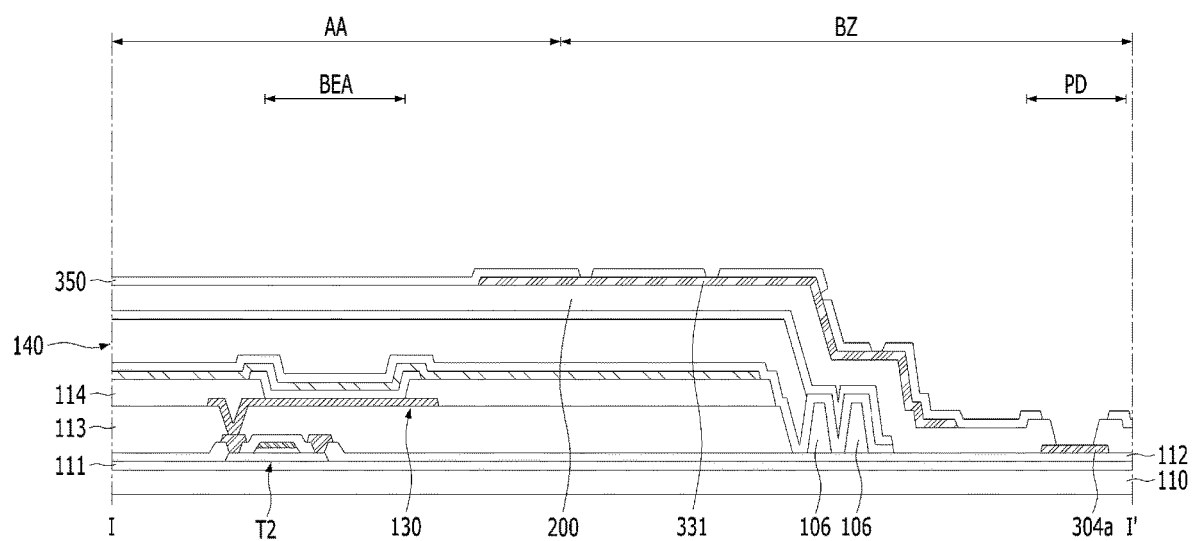
Figure 7B:
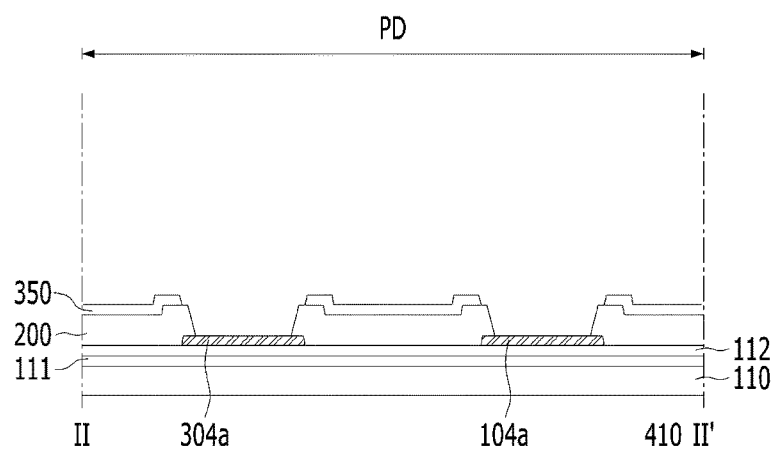
Figure 7C:
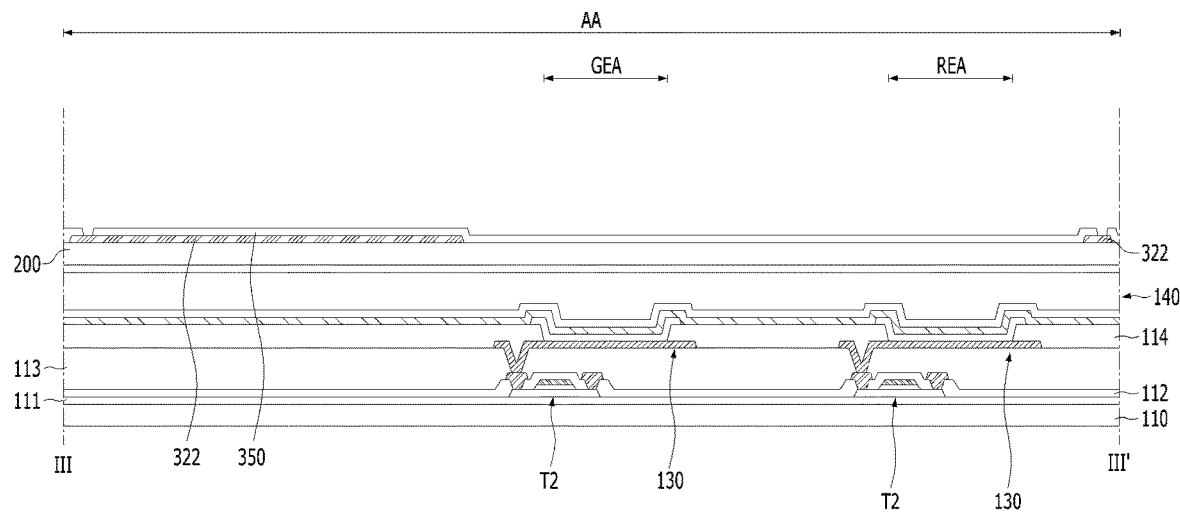

As shown in FIGS. 7A to 7C, the method of forming the touch display apparatus according to the embodiment of the present disclosure may include a step of forming a touch insulating layer 350 on the device substrate 110 in which the second bridge electrodes 322 and the lower routing lines 331 are formed.

The touch insulating layer 350 may expose a portion of each second bridge electrode 322. The touch insulating layer 350 may partially expose each lower routing line 331. The touch insulating layer 350 may expose a portion of each first lower pad electrode 104a and a portion of each second lower pad electrode 304a. For example, the step of forming the touch insulating layer 350 may include a step of forming an insulating layer on the display area AA and the bezel area BZ of the device substrate 110 and a step of patterning the insulating layer.

A step of exposing the portion of each first lower pad electrode 104a and the portion of each second lower pad electrode 304a may include a step of forming pad contact holes penetrating the touch buffer layer 200 and the touch insulating layer 350. For example, the pad contact holes may be formed by etching the touch insulating layer 350 and the touch buffer layer 200 on the portion of each first lower pad electrode 104a and the portion of each second lower pad electrode 304a.

Figure 8A:
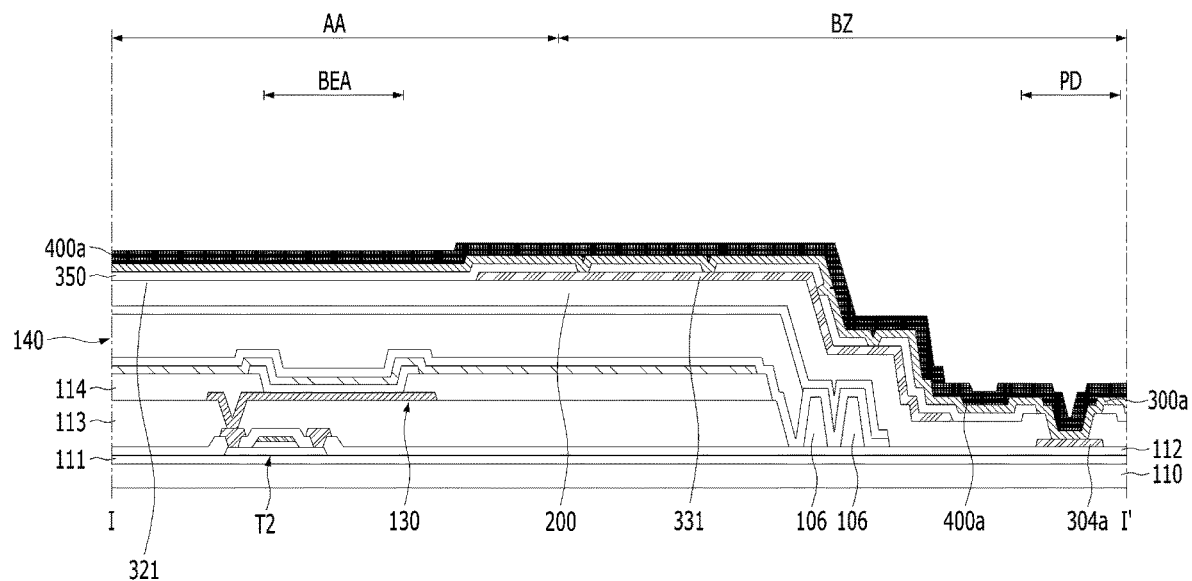
Figure 8B:
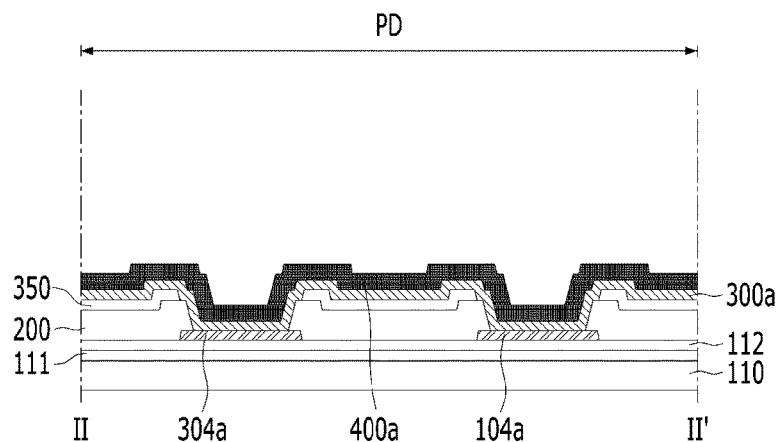
Figure 8C:
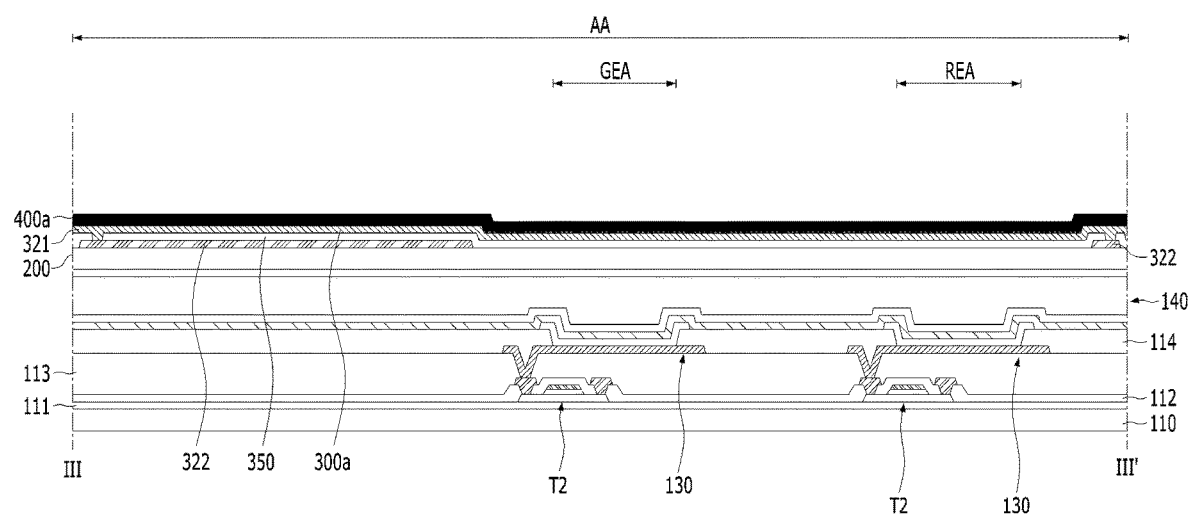

As shown in FIGS. 8A to 8C, the method of forming the touch display apparatus according to the embodiment of the present disclosure may include a step of forming a touch conductive layer 300a on the device substrate 110 in which the touch insulating layer 350 is formed, and a step of forming a black material layer 400a on the touch conductive layer 300a.

The touch conductive layer 300a may be formed of a conductive material. The touch conductive layer 300a may be formed of a material having a relative low resistance. For example, the touch conductive layer 300a may be formed of a metal, such as titanium (Ti), copper (Cu), molybdenum (Mo) and tantalum (Ta). The touch conductive layer 300a may have a multi-layer structure. For example, the touch conductive layer 300a may have a three-layer structure, such as Ti/Al/Ti, MoTi/Cu/MoTi and Ti/Al/Mo. The portion of each second bridge electrode 322, the portion of each lower routing line 331, the portion of each first lower pad electrode 104a and the portion of each second lower pad electrode 304a exposed by the touch insulating layer 350 may be in direct contact with the touch conductive layer 300a.

The black material layer 400a may be formed of a material capable of blocking light. For example, the black material layer 400a may include a black dye, such as carbon black.

Figure 9A:
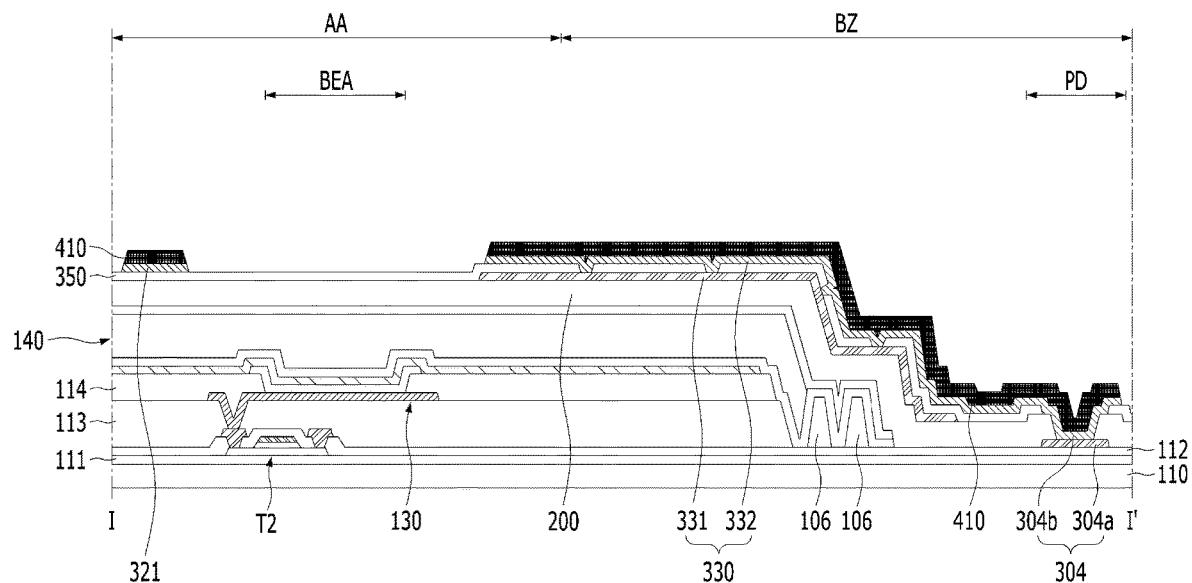
Figure 9B:
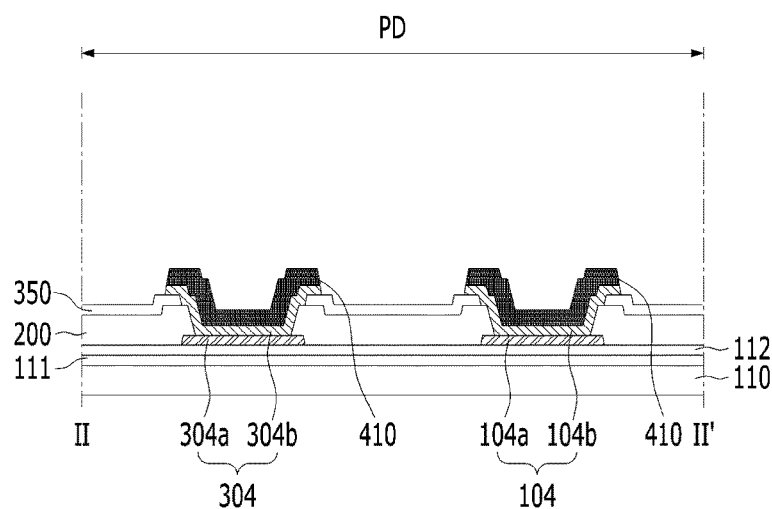
Figure 9C:
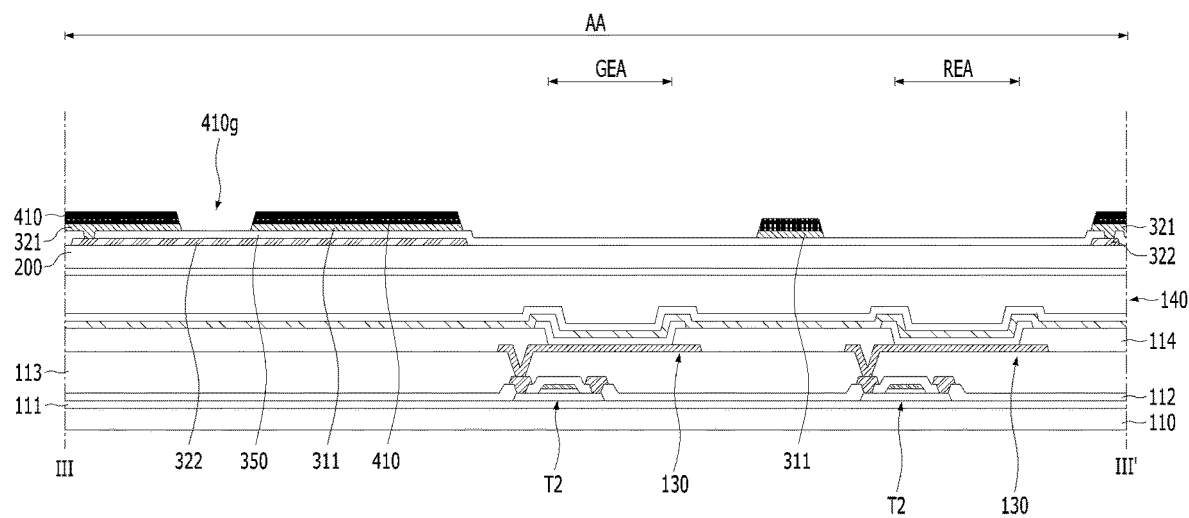

As shown in FIGS. 9A to 9C, the method of forming the touch display apparatus according to the embodiment of the present disclosure may include a step of forming first touch electrodes 311, first bridge electrodes 312, second touch electrodes 321, upper routing lines 332, first upper pad electrodes 104b, second upper pad electrodes 304b and black matrix 410 on the touch insulating layer 350.

The first touch electrodes 311, the first bridge electrodes 312 and the second touch electrodes 321 may be formed on the display area AA of the device substrate 110. The first touch electrodes 311, the first bridge electrodes 312 and the second touch electrodes 321 may be formed outside the emission areas BEA, GEA and REA. For example, the first touch electrodes 311, the first bridge electrodes 312 and the second touch electrodes 321 may overlap the bank insulating layer 114. The first touch electrodes 311 may be direct contact with the first bridge electrodes 312. For example, the first touch electrodes 311 may be connected by the first bridge electrodes 312 in a first direction to form a first touch line. The second touch electrodes 321 may be spaced away from the first touch electrodes 311. Each of the second touch electrodes 321 may be connected to one of the second bridge electrodes 322. For example, the second touch electrodes 321 may be connected by the second bridge electrodes 322 in a second direction perpendicular to the first direction to form a second touch line.

The first upper pad electrodes 104b and the second upper pad electrodes 304b may be formed on the pad area PD of the device substrate 110. The second upper pad electrodes 304b may be spaced away from the first upper pad electrodes 104b. Each of the first upper pad electrodes 104b may be connected to one of the first lower pad electrodes 104a through one of the pad contact holes. For example, each of the first lower pad electrodes 104a and the first upper pad electrode 104b connected to the corresponding first lower pad electrode 104a may form a display pad 104. Each of the second upper pad electrode 304b may be connected to one of the second lower pad electrodes 304a through one of the pad contact holes. For example, each of the second lower pad electrodes 304a and the second upper pad electrode 304b connected to the corresponding second lower pad electrode 304a may be form a touch pad 304.

The upper routing lines 332 may be formed between the display area AA and the pad area PD. Each of the upper routing lines 332 may be connected to one of the lower routing lines 331. For example, each of the lower routing lines 331 and the upper routing line 332 connected to the corresponding lower routing line 331 may form a touch routing line 330 extending along a surface of the encapsulating unit 140.

The first touch electrodes 311, the first bridge electrodes 312, the second touch electrodes 321, the upper routing lines 332, the first upper pad electrodes 104b and the second upper pad electrodes 304b may be formed using the touch conductive layer 300a. For example, the upper routing lines 332, the first upper pad electrodes 104b and the second upper pad electrodes 304b may be formed simultaneously with the first touch electrodes 311, the first bridge electrodes 312 and the second touch electrodes 321. Each of the upper routing lines 332 may be in direct contact with one of the second upper pad electrodes 304b. The black matrix 410 may be formed using the black material layer 400a. For example, the step of forming the first touch electrodes 311, the first bridge electrodes 312, the second touch electrodes 321, the upper routing lines 332, the first upper pad electrodes 104b, the second upper pad electrodes 304b and the black matrix 410 may include a step of sequentially patterning the black material layer 400a and the touch conductive layer 300a.

The first touch electrodes 311, the first bridge electrodes 312, the second touch electrodes 321, the upper routing lines 332, the first upper pad electrodes 104b, the second upper pad electrodes 304b and the black matrix 410 may be formed using a single mask pattern. For example, the step of forming the first touch electrodes 311, the first bridge electrodes 312, the second touch electrodes 321, the upper routing lines 332, the first upper pad electrodes 104b, the second upper pad electrodes 304b and the black matrix 410 may include a step of forming a mask pattern on the black material layer 400a, a step of forming the black matrix 410 by etching a portion of the black material layer 400a exposed by the mask pattern, and a step of forming the first touch electrodes 311, the first bridge electrodes 312, the second touch electrodes 321, the upper routing lines 332, the first upper pad electrodes 104b, the second upper pad electrodes 304b by removing a portion of the touch conductive layer 300a exposed by the black matrix 410.

A side of the black matrix 410 may be continuous with a side of each first touch electrode 311, a side of each first bridge electrode 312, a side of each second touch electrode 321, a side of each upper routing line 332, a side of each first upper pad electrode 104b and a side of each second upper pad electrode 304b. For example, the planar shape of the black matrix 410 in the display area AA of the device substrate 110 may be the same as the planar shape by the first touch electrodes 311, the first bridge electrodes 312 and the second touch electrodes 321. The black matrix 410 in the display area AA may include a gap 410g overlapping with a spaced region between the first touch electrodes 311 and the second touch electrodes 321.

The planar shape of the black matrix 410 between the display area AA and the pad area PD may be the same as the planar shape of the touch routing lines 330. A side of the black matrix 410 on the pad area PD of the device substrate 110 may be flush with a side of each first upper pad electrode 104b and a side of each second upper pad electrode 304b.

Figure 10A:
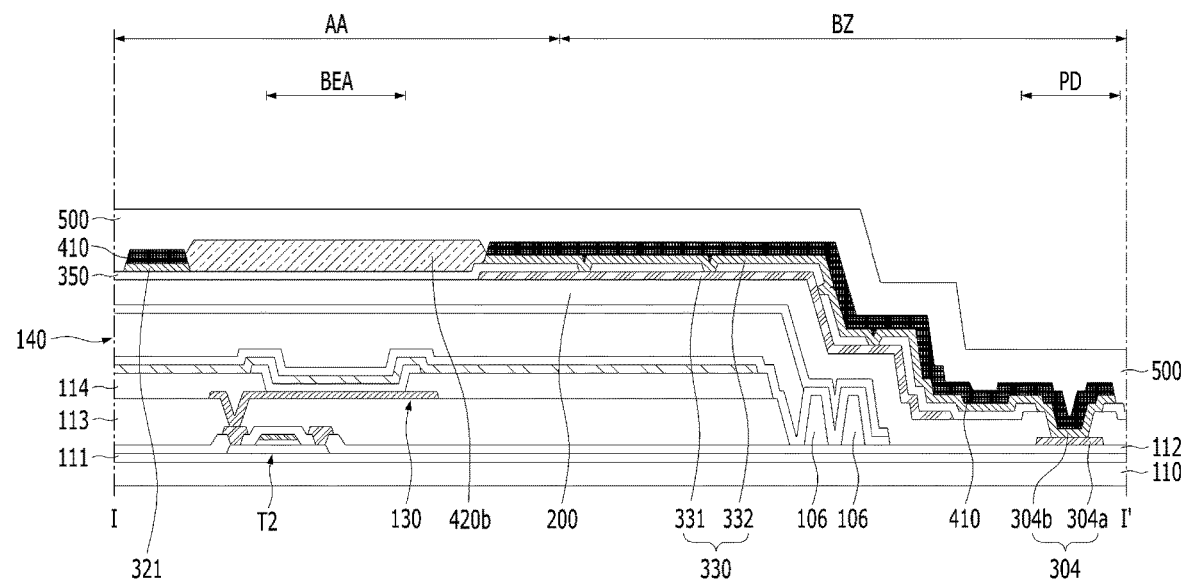
Figure 10B:
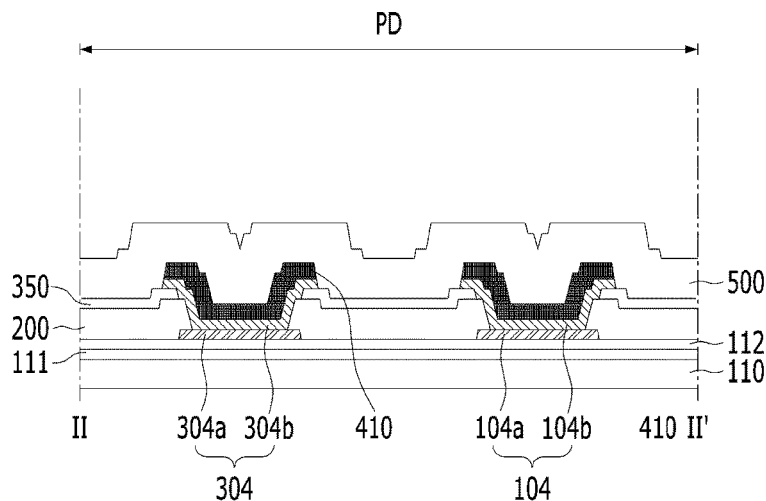
Figure 10C:
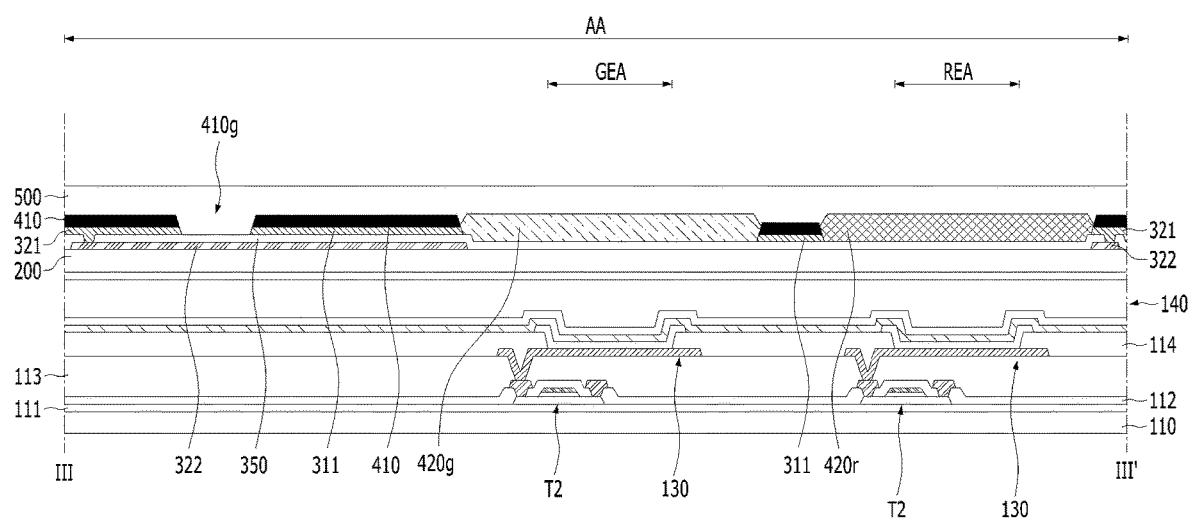

As shown in FIGS. 10A to 10C, the method of forming the touch display apparatus according to the embodiment of the present disclosure may include a step of forming color filters 420b, 420g and 420r on the device substrate 110 in which the black matrix 410 is formed, and a step of forming a touch passivation layer 500 on the device substrate 110 in which the color filters 420b, 420g and 420r are formed.

The color filters 420b, 420g and 420r may be formed on the emission areas BEA, GEA and REA. For example, each of the light-emitting device 130 may overlap one of the color filters 420b, 420g and 420r. Each of the color filters 420b, 420g and 420r may be formed of a material corresponding to a color in which the corresponding emission area BEA, GEA and REA displays. For example, the emission areas BEA, GEA and REA may include blue emission areas BEA displaying a blue color, green emission areas GEA displaying a green color and red emission areas REA displaying a red color, and the step of forming the color filters 420b, 420g and 420r may include a step of forming green color filters 420g on the green emission areas GEA, a step of forming red color filters 420r on the red emission areas REA and a step of forming blue color filters 420b on the blue emission areas BEA.

Each of the color filters 420b, 420g and 420r may be formed to have a size corresponding to the corresponding pixel area PA. For example, the color filters 420b, 420g and 420r may be not formed in the spaced region between the first touch electrodes 311 and the second touch electrodes 321 and the gap 410g of the black matrix 410.

The touch passivation layer 500 may be formed on the black matrix 410 and the color filters 420b, 420g and 420r. The black matrix 410 and the color filters 420b, 420g and 420r may be completely covered by the touch passivation layer 500. The touch passivation layer 500 may remove a difference in thickness due to the black matrix 410 and the color filters 420b, 420g and 420r on the display area AA. For example, the step of forming the touch passivation layer 500 may include a step of depositing an organic insulating material on the entire surface of the device substrate 110 in which the black matrix 410 and the color filters 420b, 420g and 420r are formed.

Figure 11A:
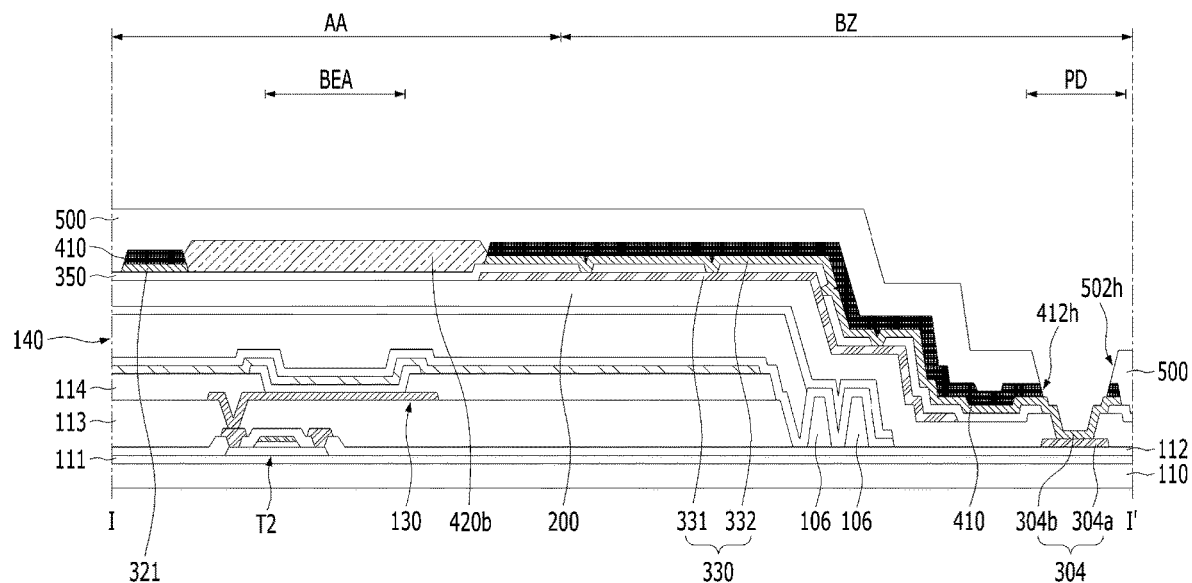
Figure 11B:
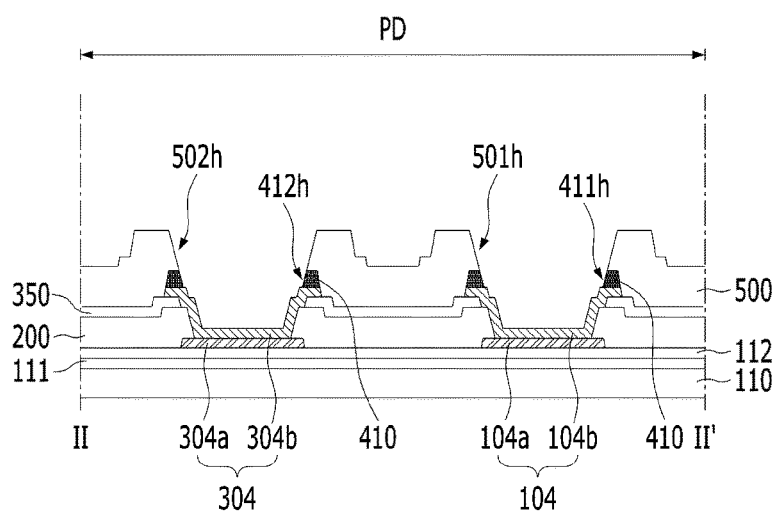
Figure 11C:
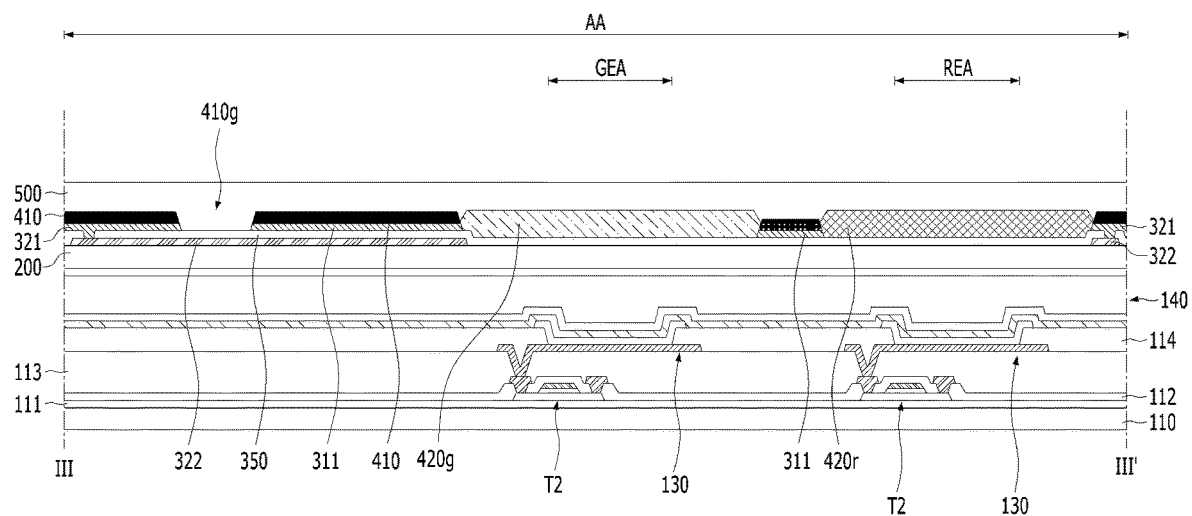

As shown in FIGS. 11A to 11C, the method of forming the touch display apparatus according to the embodiment of the present disclosure may include a step of partially exposing the display pads 104 and the touch pads 304 by partially etching the black matrix 410 and the touch passivation layer 500.

First pad open holes 501h overlapping with a center region of the first upper pad electrode 104b of each display pad 104 and a second pad open holes 502h overlapping with a center region of the second upper pad electrode 304b of each touch pad 304 may be formed in the touch passivation layer 500. First pad apertures 411h overlapping with the first pad open holes 501h and second pad apertures 412h overlapping with the second pad open holes 502h may be formed in the black matrix 410.

The first pad apertures 411h and the second pad apertures 412h of the black matrix 410 and the first pad open holes 501h and the second pad open holes 502h of the touch passivation layer 500 may be formed by a single mask pattern. For example, the step of partially exposing the display pads 104 and the touch pads 304 may include a step of forming a mask pattern on the touch passivation layer 500, a step of forming the first pad open holes 501h and the second pad open holes 502h by etching a portion of the touch passivation layer 500 exposed by the mask pattern, and a step of forming the first pad apertures 411h and the second pad apertures 412h by removing a portion of the black matrix 410 exposed by the first pad open holes 501h and the second pad open holes 502h. A side wall of each first pad aperture 411h may be continuous with a side wall of the corresponding first pad open hole 501h, and a side wall of each second pad aperture 412h may be continuous with a side wall of the corresponding second pad open hole 502h.

As shown in FIGS. 4A to 4C, the method of forming the touch display apparatus according to the embodiment of the present disclosure may include forming a cover element 600 on the touch passivation layer 500 of the display area AA.

The cover element 600 may have a stacked structure of a cover adhesive layer 610 and a cover window 620. For example, the step of forming the cover element 600 on the touch passivation layer 500 may include a step of attaching the cover window 620 to the touch passivation layer 500 using the cover adhesive layer 610.

Accordingly, the touch display apparatus according to the embodiment of the present disclosure may include the black matrix 410 on the touch sensor Cm, wherein the touch sensor Cm may include the first touch electrodes 311, the first bridge electrodes 312 and the second touch electrodes 321 on the touch insulating layer 350 covering the second bridge electrodes 322, and wherein the black matrix 410 may be formed in the same mask pattern as the first touch electrodes 311, the first bridge electrodes 312 and the second touch electrodes 321. Thus, in the touch display apparatus according to the embodiment of the present disclosure, the process of forming the touch sensor Cm and the black matrix 410 outside the emission areas BEA, GEA and REA may be simplified. Therefore, in the touch display apparatus according to the embodiment of the present disclosure, the process efficiency may be improved.

Further, in the touch display apparatus according to the embodiment of the present disclosure, a portion of each display area 104 may be exposed by one of the first pad apertures 411h penetrating the black matrix 410 and one of the first pad open holes 501h penetrating the touch passivation layer 500 which is disposed on the black matrix 410, and a portion of each touch pad 304 may be exposed by one of the second pad apertures 412h penetrating the black matrix 410 and one of the second pad open holes 502h penetrating the touch passivation layer 500, wherein the first pad apertures 411h and the second pad apertures 412h may be formed in the same mask pattern as the first pad open holes 501h and the second pad open holes 502h. Thus, in the touch display apparatus according to the embodiment of the present disclosure, the peeling of the touch passivation layer 500 from an edge of each display pad 104 and an edge of each touch pad 304 may be prevented, without degradation of the process efficiency.

In the touch display apparatus according to another embodiment of the present disclosure, the bank insulating layer 114 may include a black dye. Thus, in the touch display apparatus according to another embodiment of the present disclosure, the direction of the light emitted from the light-emitting device 130 of each pixel area PA may be restricted by the bank insulating layer 114. Therefore, in the touch display apparatus according to another embodiment of the present disclosure, the light leakage in which the light emitted from the light-emitting device 130 of each pixel area PA is unintentionally mixed with the light emitted from the light-emitting device 130 of the adjacent pixel area PA displaying a color different from the corresponding pixel area PA may be prevented.

The touch display apparatus according to the embodiment of the present disclosure is described that the pixel driving circuit of each pixel area PA is configured by the switching thin film transistor T1, the driving thin film transistor T2 and the storage capacitor Cst. However, in the touch display apparatus according to another embodiment of the present disclosure, the pixel driving circuit of each pixel area PA may include at least three thin film transistors. For example, in the touch display apparatus according to another embodiment of the present disclosure, the pixel driving circuit of each pixel area PA may further comprise an initializing thin film transistor to initialize the storage capacitor Cst according to the gate signal. The touch display apparatus according to another embodiment of the present disclosure may include a plurality of the storage capacitor Cst.

In the touch display apparatus according to the embodiment of the present disclosure, the light-emitting device 130 of each pixel area PA emits white light. However, in the touch display apparatus according to another embodiment of the present disclosure, the light emitted from the light-emitting device 130 of each pixel area PA may display a color different from the light emitted from the light-emitting device 130 of adjacent pixel area PA. For example, in the touch display apparatus according to another embodiment of the present disclosure, the light-emitting device 130 on each blue emission area BEA may emit blue light, the light-emitting device 130 on each green emission area GEA may emit green light, and the light-emitting device 130 on each red emission area REA may emit red light. The light-emitting stack 132 of each pixel area PA may be spaced away from the light-emitting stack 132 of adjacent pixel area PA. the light-emitting stack 132 of each pixel area PA may include a plurality of emission material layers. For example, the light-emitting stack 132 of each pixel area PA may have a stacked structure of a first emission material layer and a second emission material layer generating the light displaying the same color as the light generated by the first emission material layer. Thus, in the touch display apparatus according to the embodiment of the present disclosure, the luminance and the sharpness of the color realized by each pixel area PA may be improved.

Figure 12A:
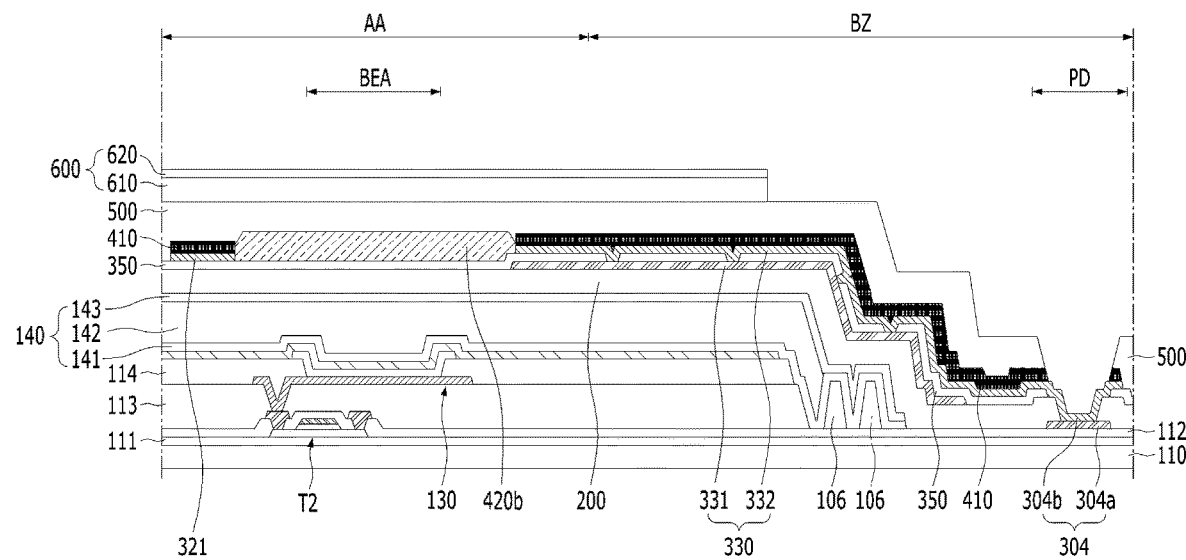
FIGS. 12A to 12C, 13, 14A to 14C, 15, 16A to 16C, 17A to 17C, 18A to 18C, 19A to 19C, 20A to 20C are views showing the touch display apparatus according to another embodiment of the present disclosure.
Figure 12B:
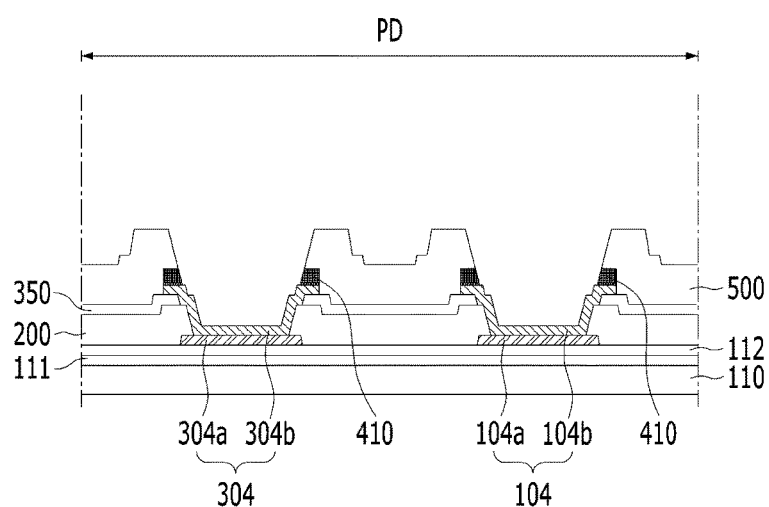
Figure 12C:
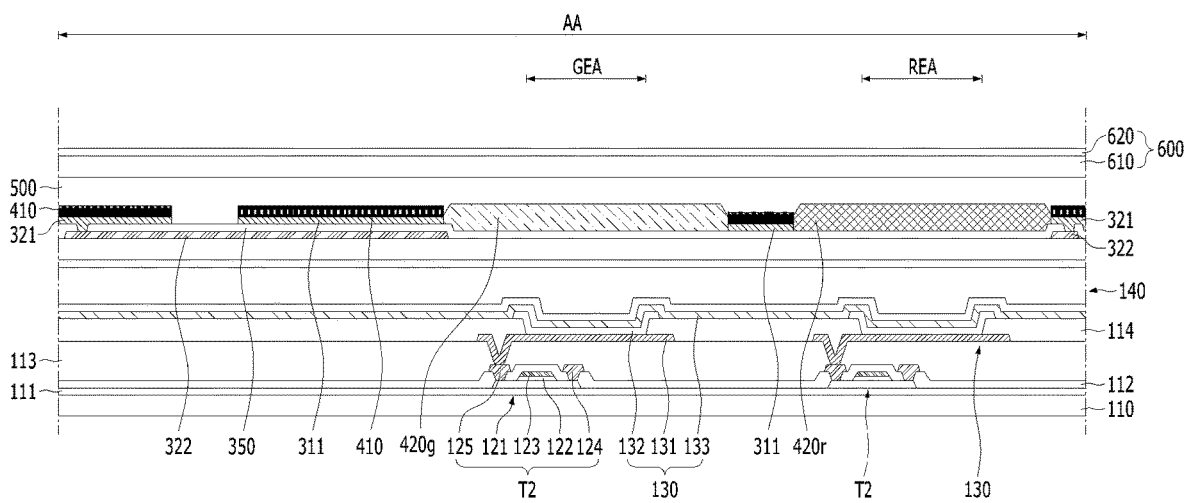
Figure 13:
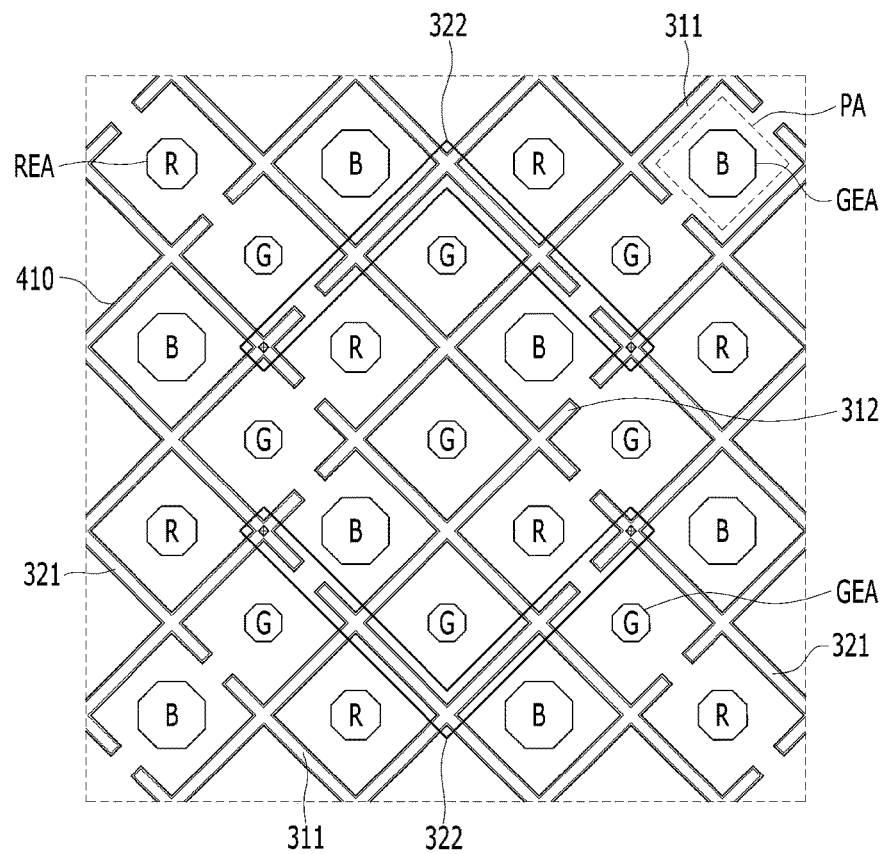
Figure 14A:
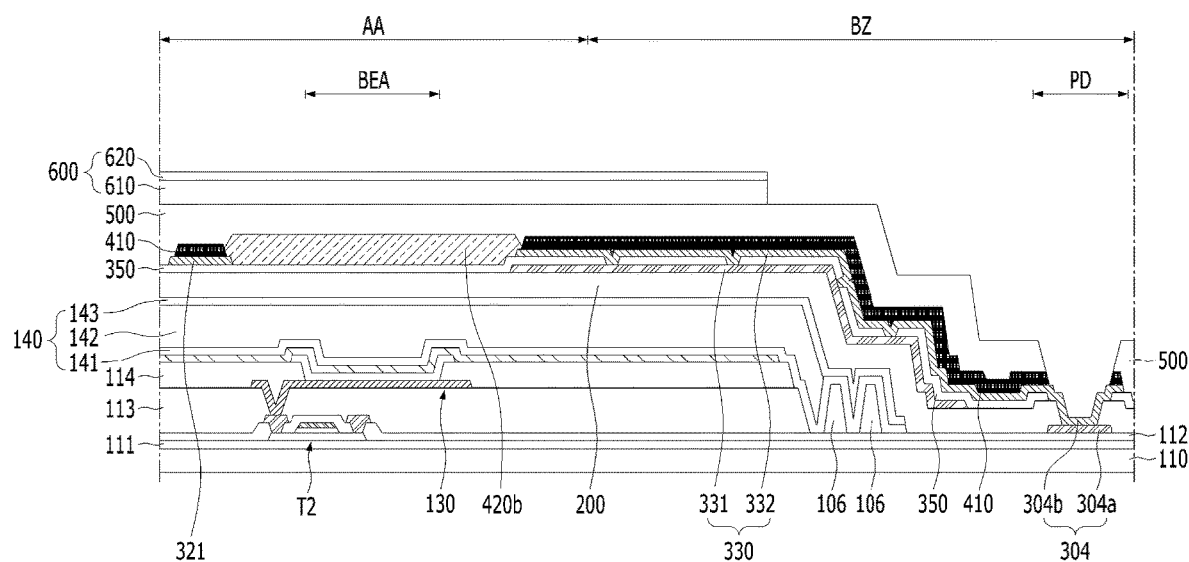
Figure 14B:
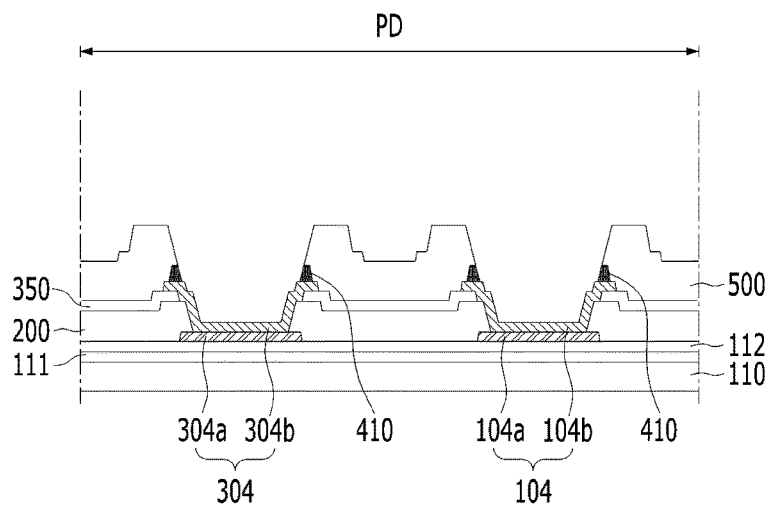
Figure 14C:
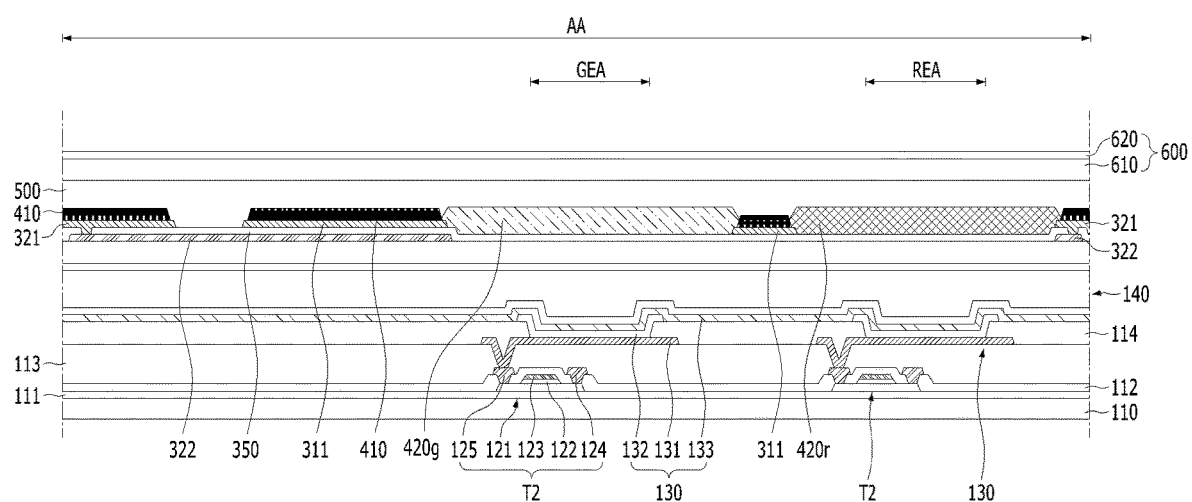
Figure 15:
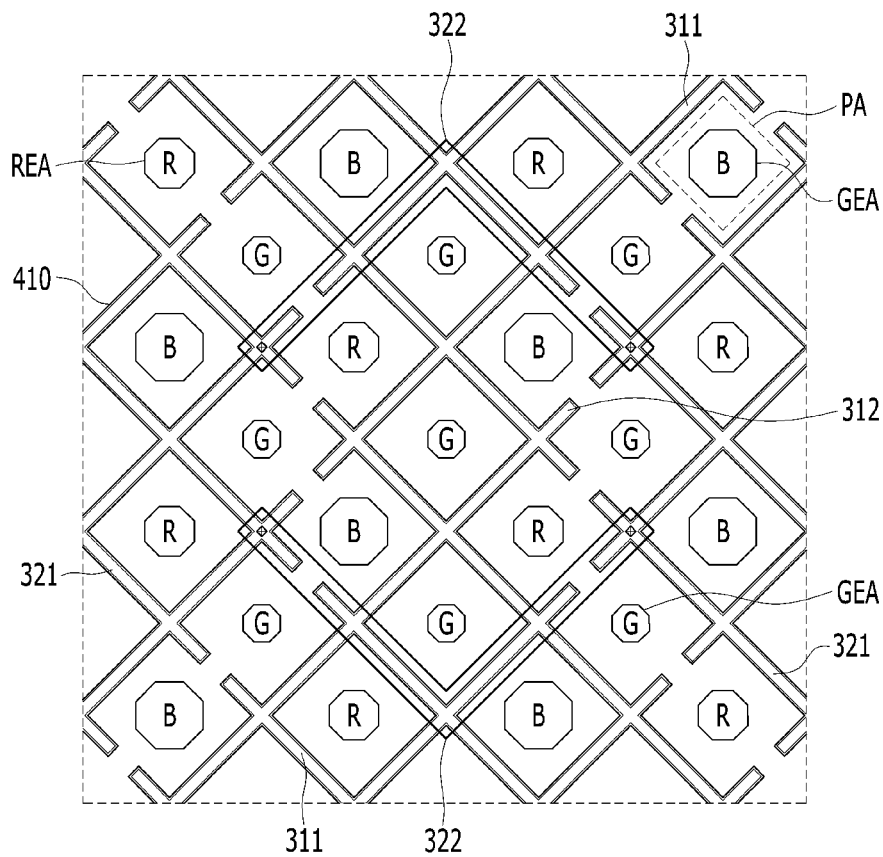
Figure 16A:
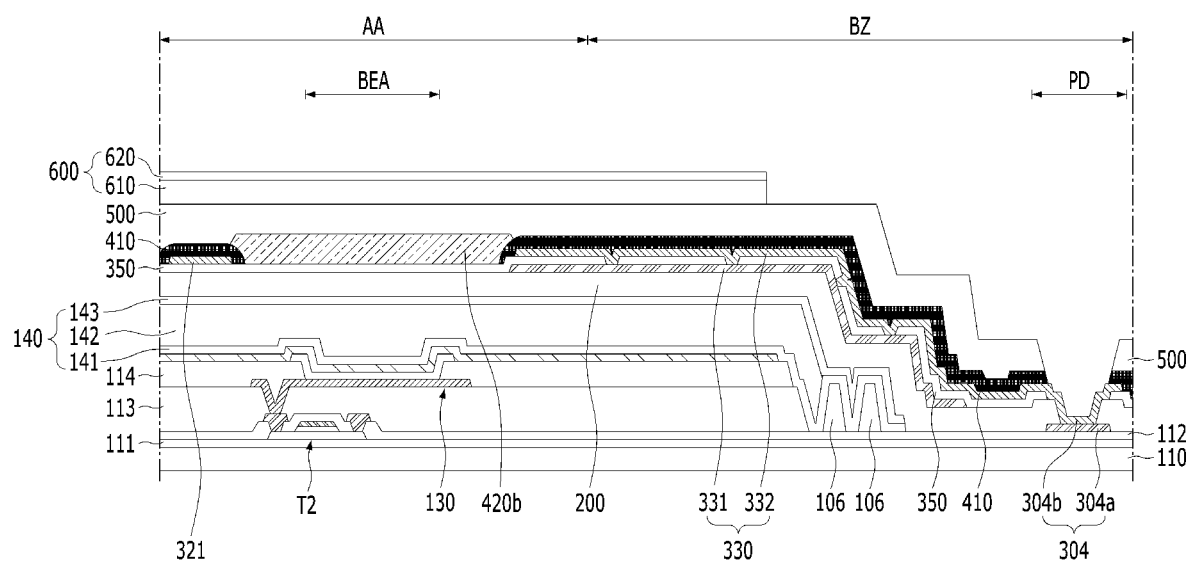
Figure 16B:
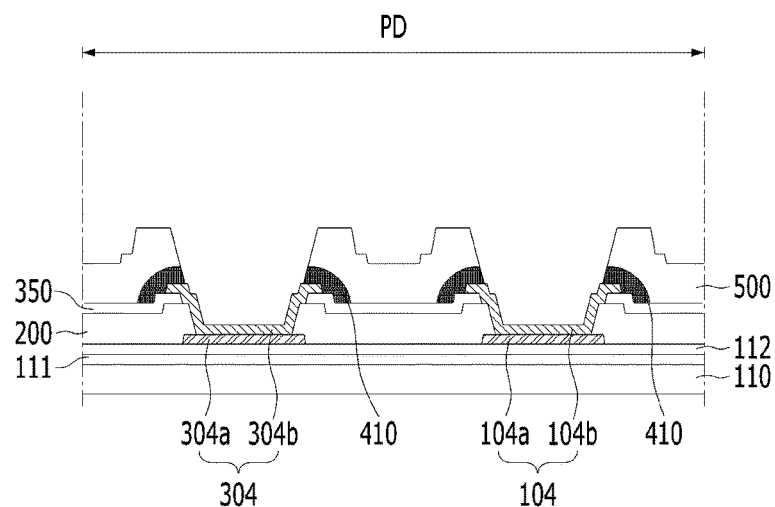
Figure 16C:
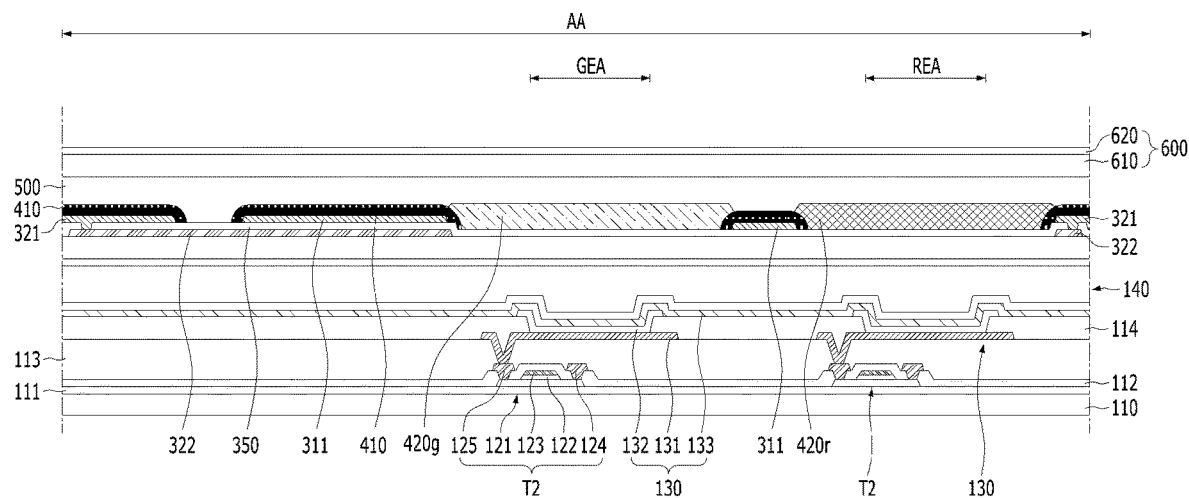

In the touch display apparatus according to the embodiment of the present disclosure, a side of each first touch electrode 311, a side of each first bridge electrode 312, a side of each second touch electrode 321, a side of each upper routing line 332, a side of each first upper pad electrode 104b, a side of each second upper pad electrode 304b, and a side of the black matrix 410 have an inclined shape. However, in the touch display apparatus according to another embodiment of the present disclosure, the side of each first touch electrode 311, the side of each first bridge electrode 312, the side of each second touch electrode 321, the side of each upper routing line 332, the side of each first upper pad electrode 104b, the side of each second upper pad electrode 304b, and the side of the black matrix 410 may be formed to be perpendicular to an upper surface of the encapsulating unit 140 opposite to the device substrate 110, as shown in FIGS. 12A to 12C. For example, the side of the black matrix 410 may be vertically aligned with the side of each first touch electrode 311, the side of each first bridge electrode 312, the side of each second touch electrode 321, the side of each upper routing line 332, the side of each first upper pad electrode 104b, and the side of each second upper pad electrode 304b. Thus, in the touch display apparatus according to another embodiment of the present disclosure, the size of each emission area BEA, GEA and REA may be maximized, and the precision in the touch location of the user and/or the tool sensed by the touch sensor Cm may be improved.

In the touch display apparatus according to another embodiment of the present disclosure, a portion of the black matrix 410 may be removed by a process of patterning the touch conductive layer 300a. For example, in the touch display apparatus according to another embodiment of the present disclosure, the planar shape of the black matrix 410 in the display area AA may be the same as the planar shape by the first touch electrodes 311, the first bridge electrodes 312 and the second touch electrodes 321, wherein the width of the black matrix 410 may be smaller than the width of each first touch electrode 311 and the width of each second touch electrode 321, as shown in FIGS. 13 and 14A to 14C.

In the touch display apparatus according to the embodiment of the present disclosure, the black matrix 410 is disposed only on an upper surface of each first touch electrode 311, an upper surface of each first bridge electrode 312, an upper surface of each second touch electrode 321, an upper surface of each upper routing line 332, an upper surface of each first upper pad electrode 104b and an upper surface of each second upper pad electrode 304b, which are opposite to the device substrate 110. However, in the touch display apparatus according to another embodiment of the present disclosure, the black matrix 410 may extend onto a side of each first touch electrode 311, a side of each first bridge electrode 312, a side of each second touch electrode 321, a side of each upper routing line 332, a side of each first upper pad electrode 104b, and a side of each second upper pad electrode 304b, as shown in FIGS. 15 and 16A to 16C. For example, a method of forming the touch display apparatus according to another embodiment of the present disclosure may include a step of reflowing the black matrix 410 before forming the color filters 420b, 420g and 420r. That is, in the touch display apparatus according to another embodiment of the present disclosure, the planar shape of the black matrix 410 in the display area AA may be the same as the planar shape by the first touch electrodes 311, the first bridge electrodes 312 and the second touch electrodes 321, wherein the width of the black matrix 410 may be larger than the width of each first touch electrode 311 and the width of each second touch electrode 321. Thus, in the touch display apparatus according to another embodiment of the present disclosure, the color filters 420b, 420g and 420r may cover a portion of the black matrix 410 which flows down on the side of each first touch electrode 311, the side of each first bridge electrode 312, the side of each second touch electrode 321, the side of each upper routing line 332, the side of each first upper pad electrode 104b, and the side of each second upper pad electrode 304b. The gap 410g of the black matrix 410 overlapping with the spaced region between the first touch electrodes 311 and the second touch electrodes 321 may have a smaller size than the spaced region between the first touch electrodes 311 and the second touch electrodes 321. Therefore, in the touch display apparatus according to another embodiment of the present disclosure, the light leakage due to the spaced region between the first touch electrodes 311 and the second touch electrodes 321 may be reduced.

Figure 17A:
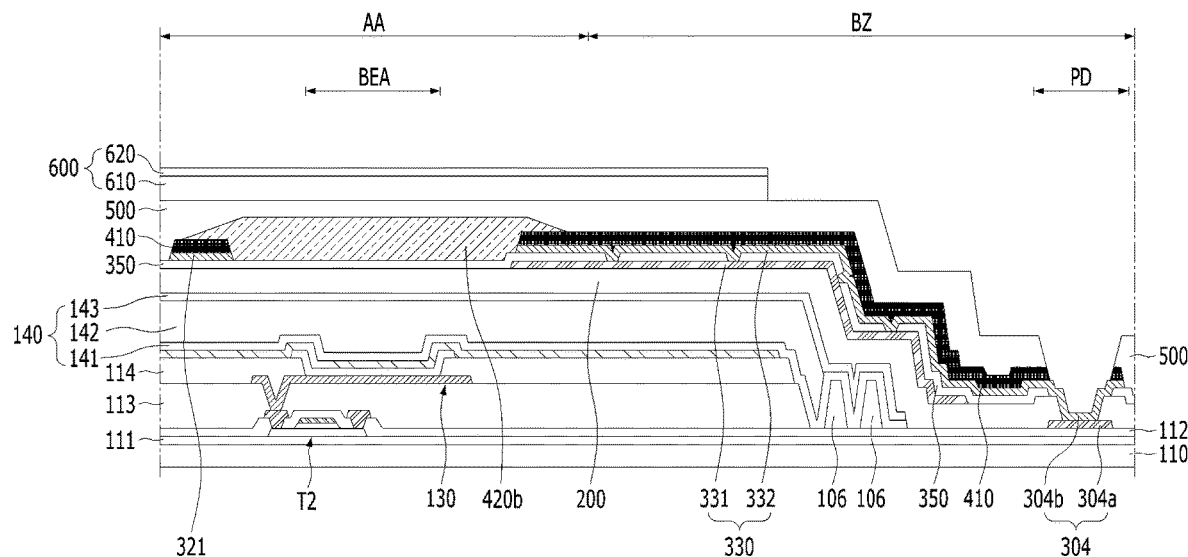
Figure 17B:
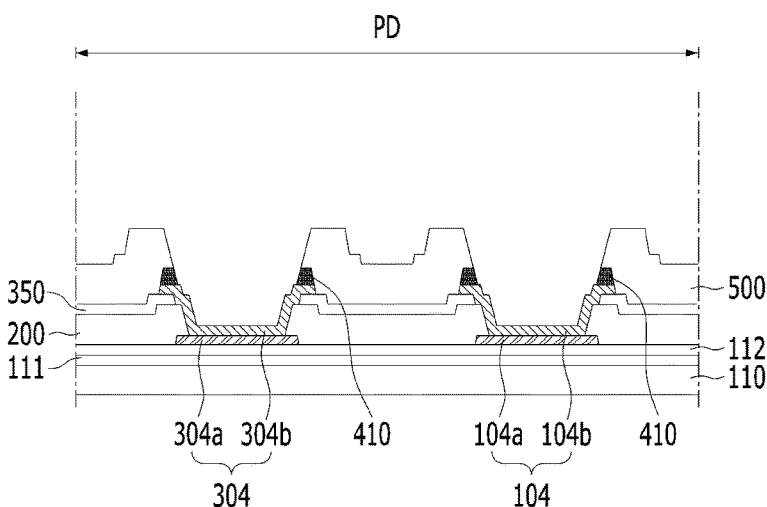
Figure 17C:
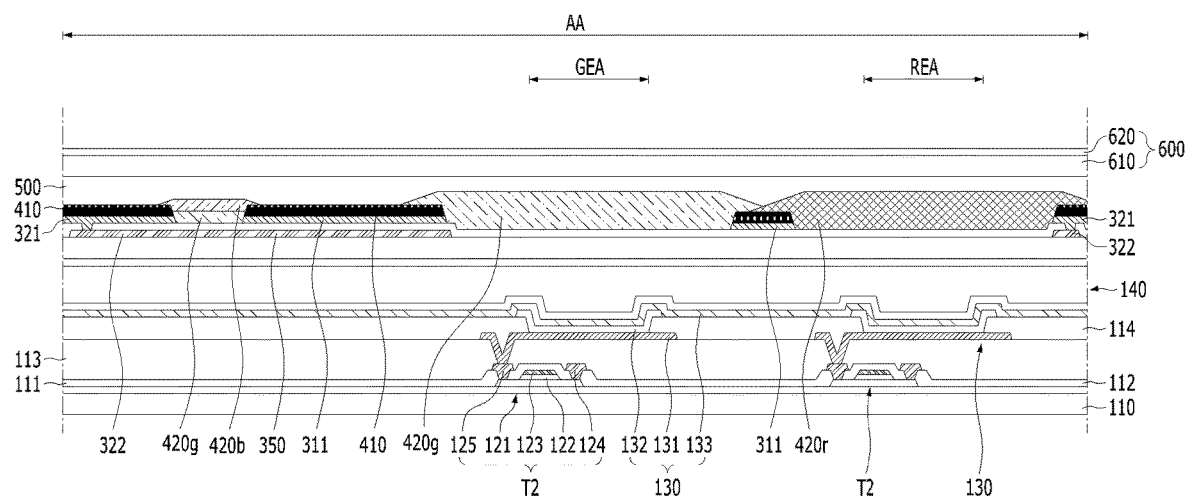

In the touch display apparatus according to another embodiment of the present disclosure, each of the color filters 420b, 420g and 420r may be formed to be wider than the corresponding emission area BEA, GEA and REA. For example, in the touch display apparatus according to another embodiment of the present disclosure, the color filters 420b, 420g and 420r realizing different colors may be stacked in the gap 410g of the black matrix 410 overlapping with the spaced region between the first touch electrodes 311 and the second touch electrodes 321, as shown in FIGS. 17A to 17C. Thus, in the touch display apparatus according to the embodiment of the present disclosure, the light leakage due to the spaced region between the first touch electrodes 311 and the second touch electrodes 321 may be prevented by the color filters 420b, 420g and 420r which are stacked in the gap 410g of the black matrix 410. Ends of the color filters 420b, 420g and 420r realizing different colors may be stacked on the black matrix 410. Therefore, in the touch display apparatus according to another embodiment of the present disclosure, the reflection of the external light may be prevented by the color filters 420b, 420g and 420r, which are stacked on the black matrix 410.

Figure 18A:
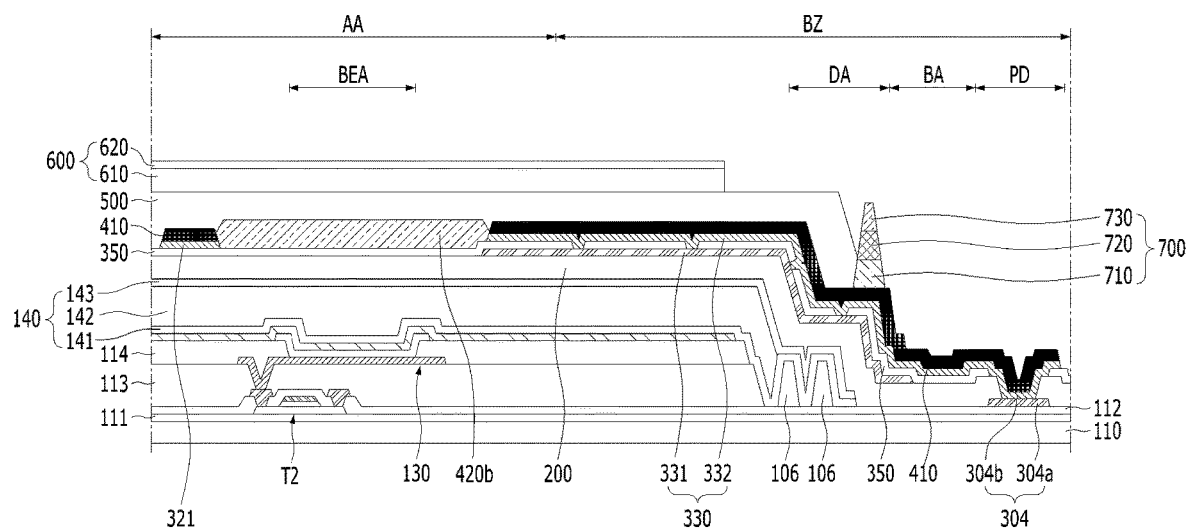
Figure 18B:
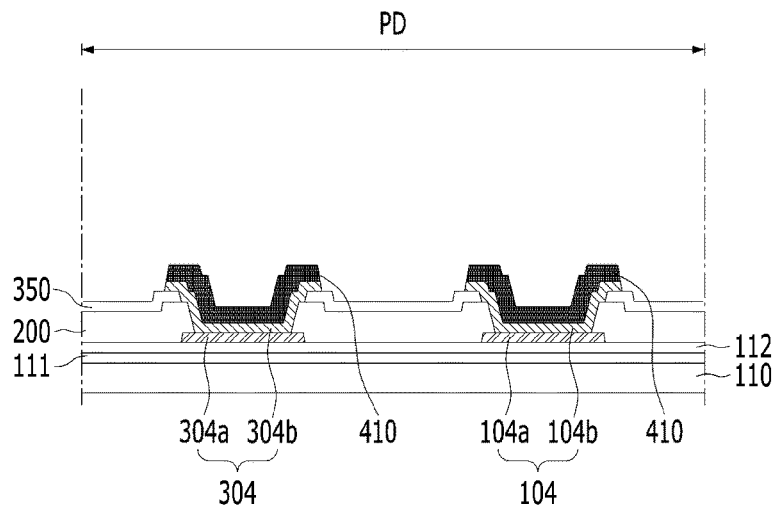
Figure 18C:
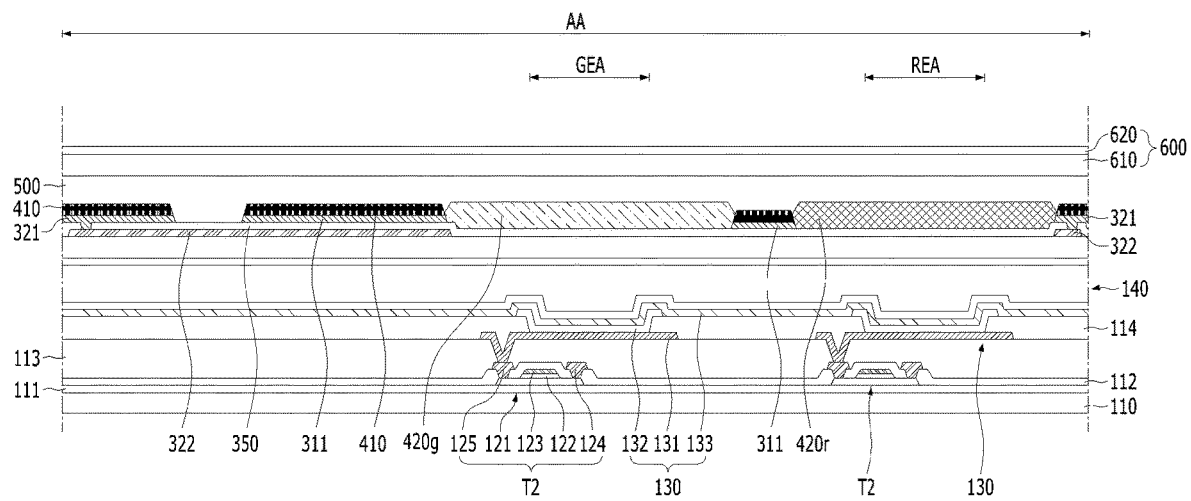

In the touch display apparatus according to another embodiment of the present disclosure, a portion of the device substrate 110 may be bent. For example, in the touch display apparatus according to another embodiment of the present disclosure, the bezel area BZ of the device substrate 110 may include a dam area DA, a bending area BA and a pad area PD, as shown in FIGS. 18A to 18C. The dam area DA may be disposed close to the display area AA. For example, the dam 106 defining the formation position of the encapsulating unit 140 may be disposed on the dam area DA of the device substrate 110. The bending area BA may be disposed between the dam area DA and the pad area PD. The bending area BA may be an area bent by a subsequent process. For example, the pad area PD of the device substrate 110 may be disposed to overlap with the display area AA of the device substrate 110 by a subsequent process.

In the touch display apparatus according to another embodiment of the present disclosure, the touch passivation layer 500 may not extend onto the bending area BA and the pad area PD. For example, a partition 700 blocking the flow of the touch passivation layer 500 may be formed on the black matrix 410 on the dam area DA. The partition 700 may be formed using a process of forming the color filters 420b, 420g and 420r. For example, the partition 700 may have a stacked structure of a first pattern 710 including the same material as the green color filter 420g, a second pattern 720 including the same material as the red color filter 420r, and a third pattern 730 including the same material as the blue color filter 420b. Thus, in the touch display apparatus according to another embodiment of the present disclosure, the bending stress due to bending of the bending area BA may be reduced, without degradation of the process efficiency.

In the touch display apparatus according to another embodiment of the present disclosure, the black matrix 410 may be disposed on the display pads 104 and the touch pads 304. For example, in the touch display apparatus according to another embodiment of the present disclosure, external terminals may be connected to the display pads 104 or the touch pads 304 covered by the black matrix 410 by an indentation process. Thus, in the touch display apparatus according to another embodiment of the present disclosure, damage in a surface of the display pads 104 and a surface of the touch pads 304 due to a foreign object and/or the external impact before the external terminals are connected may be prevented.

Figure 19A:
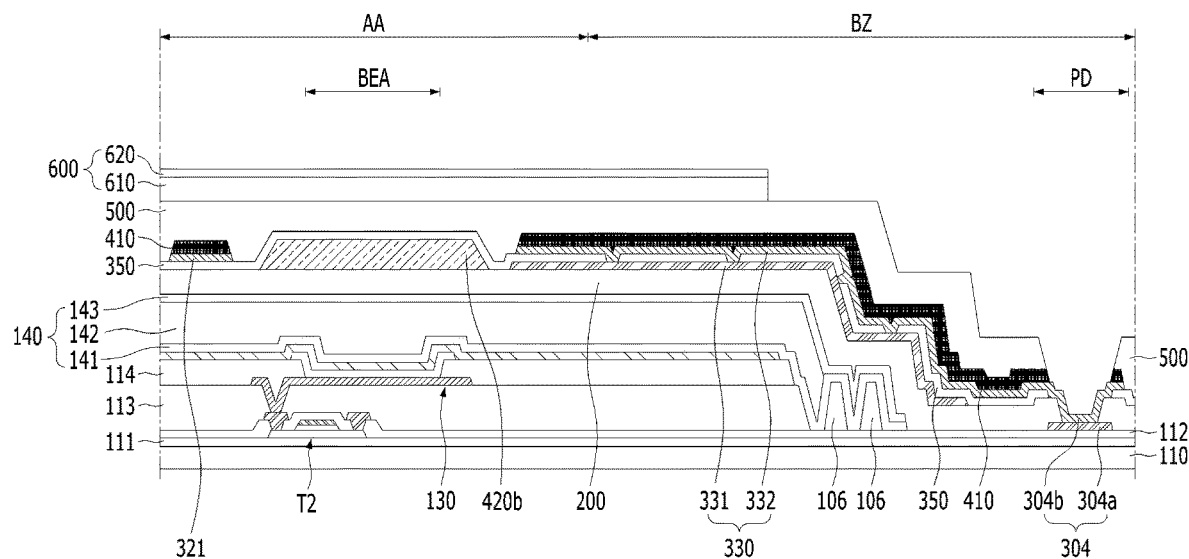
Figure 19B:
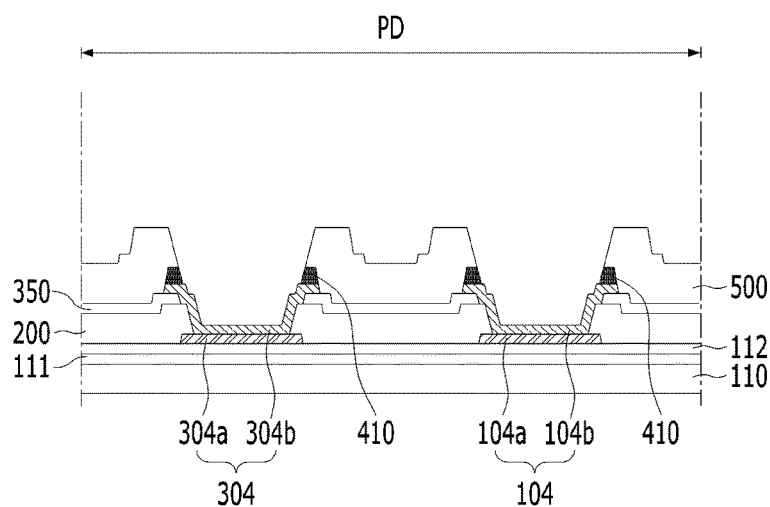
Figure 19C:
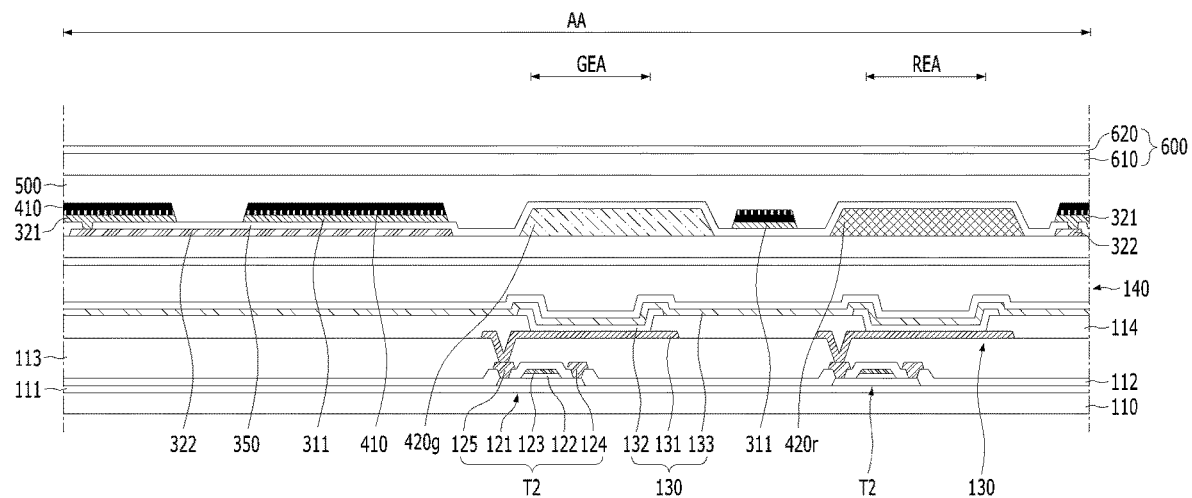

In the touch display apparatus according to the embodiment of the present disclosure, the color filters 420b, 420g and 420r are disposed on the touch insulating layer 350. However, in the touch display apparatus according to another embodiment of the present disclosure, the color filters 420b, 420g and 420r may be formed at various locations. For example, in the touch display apparatus according to another embodiment of the present disclosure, the touch insulating layer 350 may be formed after the color filters 420b, 420g and 420r are formed on the touch buffer layer 200, as shown in FIGS. 19A to 19C. That is, in the touch display apparatus according to another embodiment of the present disclosure, the color filters 420b, 420g and 420r may be disposed between the touch buffer layer 200 and the touch insulating layer 350. Thus, in the touch display apparatus according to another embodiment of the present disclosure, the degree of freedom for the forming process of the color filters 420b, 420g and 420r may be improved.

Figure 20A:
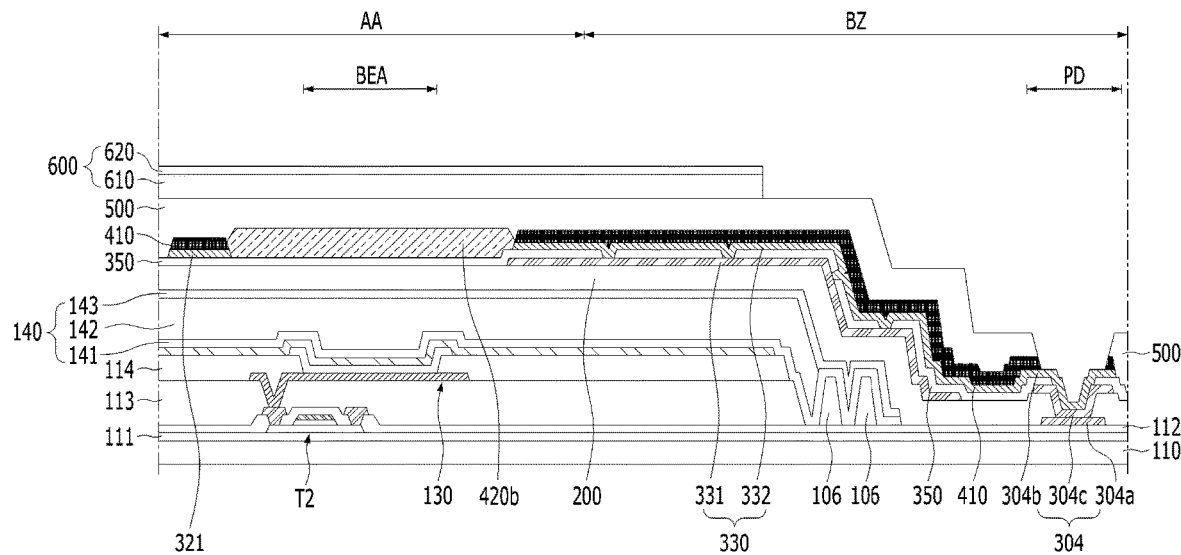
Figure 20B:
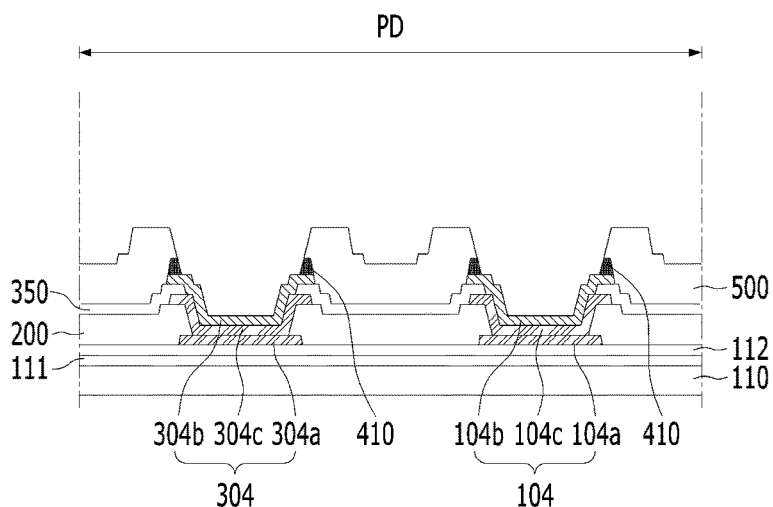
Figure 20C:
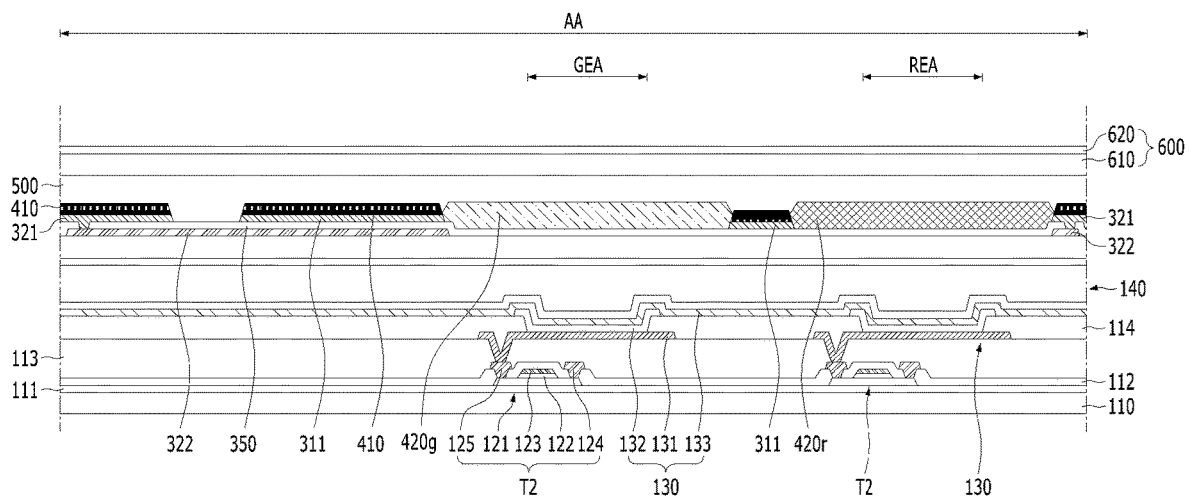

In the touch display apparatus according to the embodiment of the present disclosure, each of the display pads 104 and the touch pads 304 has a two-layer structure. However, in the touch display apparatus according to the embodiment of the present disclosure, the display pads 104 and the touch pads 304 may be formed in various structures. For example, in the touch display apparatus according to another embodiment of the present disclosure, each of the display pads 104 may include a first intermediate pad electrode 104c disposed between the first lower pad electrode 104a and the first upper pad electrode 104b, and each of the touch pads 304 may include a second intermediate pad electrode 304c disposed between the second lower pad electrode 304a and the second upper pad electrode 304b, as shown in FIGS. 20A to 20C. The first intermediate pad electrodes 104c and the second intermediate pad electrodes 304c may include the same material as the second bridge electrode 322. For example, the first intermediate pad electrodes 104c and the second intermediate pad electrodes 304c may be formed simultaneously with the second bridge electrodes 322. An edge of each first intermediate pad electrode 104c and an edge of each second intermediate pad electrode 304c may be covered by the touch insulating layer 350. Thus, in the touch display apparatus according to another embodiment of the present disclosure, each of the first upper pad electrodes 104b may be stably connected to the corresponding first lower pad electrode 104a, and each of the second upper pad electrodes 304b may be stably connected to the corresponding second lower pad electrode 304a. Therefore, in the touch display apparatus according to another embodiment of the present disclosure, the signal loss and delay due to the display pads 104 and the touch pads 304 may be prevented or at least reduced.

The touch display apparatus according to the embodiments of the present disclosure may include the touch sensor on the encapsulating unit covering the light-emitting devices and the black matrix on the touch sensor, wherein the touch sensor may include the first touch electrodes, the second touch electrodes, the first bridge electrodes and the second bridge electrodes, and wherein the black matrix may be formed using the same mask pattern as the first touch electrodes, the second touch electrodes and the first bridge electrodes, which are disposed on the same layer, such that the planar shape of the black matrix may be the same as the planar shape by the first touch electrodes, the second touch electrodes and the first bridge electrodes. Thus, in the touch display apparatus according to the embodiments of the present disclosure, the process using a mask pattern may be reduced. Thereby, in the touch display apparatus according to the embodiments of the present disclosure, a decrease in process efficiency may be minimized, and the deterioration of the image due to reflection of the external light may be prevented.

What is claimed is:
1. A touch display apparatus comprising:
a light emitting device disposed in an active area of a substrate;
an encapsulation unit disposed on the light emitting device;
a touch buffer layer disposed on the encapsulation unit;
a second bridge electrode disposed on the touch buffer layer;
a touch insulation layer disposed on the touch buffer layer, the touch insulation layer covering the second bridge electrode;
a first sensor layer disposed on the touch insulation layer, the first sensor layer including a first touch electrode and a first bridge electrode electrically connected to the first touch electrode;
a second touch electrode disposed on the touch insulation layer, the second touch electrode electrically connected to the second bridge electrode;
a black matrix disposed on the first touch electrode, the second touch electrode and the first bridge electrode; and
a color filter disposed on the touch insulation layer and disposed in a color disposition area defined by the black matrix, the first sensor layer, and the second touch electrode,
wherein the color filter is disposed on a same layer as the first sensor layer and the second touch electrode.
2. The touch display apparatus of claim 1, wherein the black matrix is disposed directly on the first touch electrode, the first bridge electrode, and the second touch electrode.
3. The touch display apparatus of claim 1, wherein the color filter has a bottom surface in contact with a top surface of the touch insulation layer, and
a side surface both of the first sensor layer, a side surface of the second touch electrode and a side surface of the black matrix are in contact with a side of the color filter.
4. The touch display apparatus of claim 1, further comprising a bezel area disposed outside the active area,
wherein
the bezel area comprises:
a first bezel area connected to the active area, an end portion of the encapsulation unit being disposed in the first bezel area;
a pad area where a touch pad is disposed; and a second bezel area connected to each of the first bezel area and the pad area and disposed between the first bezel area and the pad area, and the touch pad is connected to a routing line extending from the first sensor layer or the second touch electrode of the active area.

5. A touch display apparatus comprising:
a light emitting device disposed in an active area of a substrate;
an encapsulation unit disposed on the light emitting device;
a touch buffer layer disposed on the encapsulation unit;
a second bridge electrode disposed on the touch buffer layer;
a touch insulation layer disposed on the touch buffer layer, the touch insulation layer covering the second bridge electrode;
a first sensor layer disposed on the touch insulation layer, the first sensor layer including a first touch electrode and a first bridge electrode electrically connected to the first touch electrode;
a second touch electrode on the touch insulation layer, the second touch electrode electrically connected to the second bridge electrode;
a black matrix disposed on the second touch electrode and the first sensor layer; and
a color filter disposed on the touch insulation layer and disposed between the black matrix, the first sensor layer, and the second touch electrode,
wherein both the first sensor layer and the second touch electrode overlap in a first, lateral direction with the color filter.

6. The touch display apparatus of claim 5, wherein the black matrix is in contact with an upper surface of the first touch electrode, an upper surface the first bridge electrode, and an upper surface of the second touch electrode, and
each of the upper surface of the first touch electrode, the upper surface the first bridge electrode, and the upper surface of the second touch electrode is a surface opposite to the device substrate.

7. The touch display apparatus of claim 5, wherein the color filter has a bottom surface in contact with a top surface of the touch insulation layer, and
both a side surface of the second touch electrode and a side surface of the black matrix are in contact with a side of the color filter.

8. The touch display apparatus of claim 5, further comprising:
a first bezel area connected to the active area, an end portion of the encapsulation unit being disposed in the first bezel area;
a pad area including a touch pad that is connected to a routing line extending from the first sensor layer or the second touch electrode of the active area; and
a second bezel area disposed between the first bezel area and the pad area.

9. A touch display apparatus comprising:
light-emitting devices on a display area of a device substrate;
an encapsulating unit on the device substrate, the encapsulating unit covering the light-emitting device;
upper pad electrodes on a bezel area of the device substrate, the bezel area disposed outside the display area;
a touch insulating layer on the encapsulating unit;

a first touch line on the touch insulating layer, the first touch line including first touch electrodes and first bridge electrodes connecting between the first touch electrodes in a first direction;
a second touch line including second bridge electrodes between the encapsulating unit and the touch insulating layer and second touch electrodes connected by the second bridge electrodes in a second direction perpendicular to the first direction;
touch routing lines electrically connecting the first touch line and the second touch line to the upper pad electrodes; and
a black matrix on the first touch electrodes, the first bridge electrodes and the second touch electrodes,
wherein each of the first touch line, the second touch line and the black matrix has a mesh shape including openings overlapping with the light-emitting devices,
wherein a planar shape of the black matrix is the same as a planar shape by the first touch electrodes, the first bridge electrodes and the second touch electrodes, which are disposed on the same layer, and
wherein the black matrix includes pad apertures overlapping with the upper pad electrodes.

10. The touch display apparatus according to claim 9, wherein the black matrix is in contact with an upper surface of each first touch electrode, an upper surface of each first bridge electrode and an upper surface of each second touch electrode, which are opposite to the device substrate.

11. The touch display apparatus according to claim 9, wherein:
the touch routing lines extend along a surface of the encapsulating unit, and
the black matrix overlaps the touch routing lines.

12. The touch display apparatus according to claim 11, wherein the planar shape of the black matrix between the display area and the upper pad electrodes is the same as a planar shape of the touch routing lines.

13. The touch display apparatus according to claim 11, further comprising lower pad electrodes between the device substrate and the upper pad electrodes, each of the lower pad electrodes electrically connected to one of the upper pad electrodes,
wherein the upper pad electrodes include a same material as the first touch electrodes, the first bridge electrodes and the second touch electrodes, and
wherein an edge of an upper surface of each upper pad electrode opposite to the device substrate is covered by the black matrix.

14. The touch display apparatus according to claim 13, further comprising:
a touch passivation layer on the black matrix; and
a touch buffer layer between the encapsulating unit and the touch insulating layer, wherein the touch passivation layer includes pad open holes overlapping with the pad apertures of the black matrix,
wherein the touch buffer layer includes penetrating holes to connect each upper pad electrode to the corresponding lower pad electrode, and
wherein the pad apertures of the black matrix overlap the penetrating holes of the touch buffer layer.

15. The touch display apparatus according to claim 14, wherein a side wall of each pad aperture is continuous with a side wall of the corresponding pad open hole.

16. A touch display apparatus comprising:
a bank insulating layer on a device substrate, the bank insulating layer defining emission areas;

light-emitting devices on the emission areas of the device substrate;

an encapsulating unit on the bank insulating layer and the light-emitting devices;

a touch sensor on the encapsulating unit, the touch sensor including first touch electrodes connected in a first direction and second touch electrodes connected in a second direction intersecting the first direction;

touch pads spaced apart from the encapsulating unit, each of the touch pads including a lower pad electrode and an upper pad electrode electrically connected to the lower pad electrode;

touch routing lines electrically connecting the first touch electrodes and the second touch electrodes to the touch pads;

a black matrix on the first touch electrodes the second touch electrodes and the touch routing lines; and a touch passivation layer on the black matrix, the touch passivation layer including pad open holes overlapping with the upper pad electrode of each touch pads, wherein the first touch electrodes, the second touch electrodes and the black matrix are disposed between the emission areas, and wherein the black matrix includes pad apertures overlapping with the pad open holes of the touch passivation layer.

17. The touch display apparatus according to claim 16, wherein the black matrix includes a gap overlapping with a spaced region between the first touch electrodes and the second touch electrodes, and the gap of the black matrix overlaps the bank insulating layer.

* * * * *